United States Patent
Kawajiri et al.

(10) Patent No.: US 10,371,772 B2
(45) Date of Patent: Aug. 6, 2019

(54) MAGNETIC RESONANCE IMAGING APPARATUS

(71) Applicant: Canon Medical Systems Corporation, Otawara-shi (JP)

(72) Inventors: Sho Kawajiri, Nasushiobara (JP); Motohiro Miura, Yaita (JP); Naoyuki Furudate, Otawara (JP); Yutaka Machii, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 141 days.

(21) Appl. No.: 15/377,249

(22) Filed: Dec. 13, 2016

(65) Prior Publication Data

US 2017/0176555 A1 Jun. 22, 2017

(30) Foreign Application Priority Data

Dec. 17, 2015 (JP) ................................ 2015-246584

(51) Int. Cl.
*G01V 3/00* (2006.01)
*G01R 33/385* (2006.01)
*G01R 33/3875* (2006.01)

(52) U.S. Cl.
CPC ..... *G01R 33/3852* (2013.01); *G01R 33/3875* (2013.01)

(58) Field of Classification Search
CPC .............. G01R 33/5608; G01R 33/543; G01R 33/3815; G01R 33/3804; A61B 5/055
USPC ....................................................... 324/322
See application file for complete search history.

(56) References Cited

U.S. PATENT DOCUMENTS

| 2007/0159549 | A1* | 7/2007 | Matsumoto | H04N 5/232 348/333.11 |
| 2012/0194202 | A1* | 8/2012 | Xiao | H02H 7/1203 324/548 |
| 2013/0009639 | A1* | 1/2013 | Ookawa | A61B 5/055 324/307 |
| 2013/0009641 | A1* | 1/2013 | Hori | G01R 33/3852 324/309 |
| 2017/0045595 | A1 | 2/2017 | Machii et al. | |

FOREIGN PATENT DOCUMENTS

JP 2013-173 1/2013
JP 2017-35305 A 2/2017

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

According to one embodiment, a magnetic resonance imaging apparatus includes a gradient magnetic field power supply, a voltmeter, and processing circuitry. The gradient magnetic field power supply includes an amplifier amplifying an input signal based on information of a gradient magnetic field waveform and outputting the amplified input signal to a gradient coil, a power supply device supplying power to the amplifier, and a capacitor bank supplying power, together with the power supply device, to the amplifier. The voltmeter measures a voltage of the capacitor bank. The processing circuitry calculates frequency characteristics of an impedance of the gradient coil, based on a voltage variation of the capacitor bank which was measured by the voltmeter, and controls imaging in accordance with the calculated frequency characteristics.

9 Claims, 10 Drawing Sheets

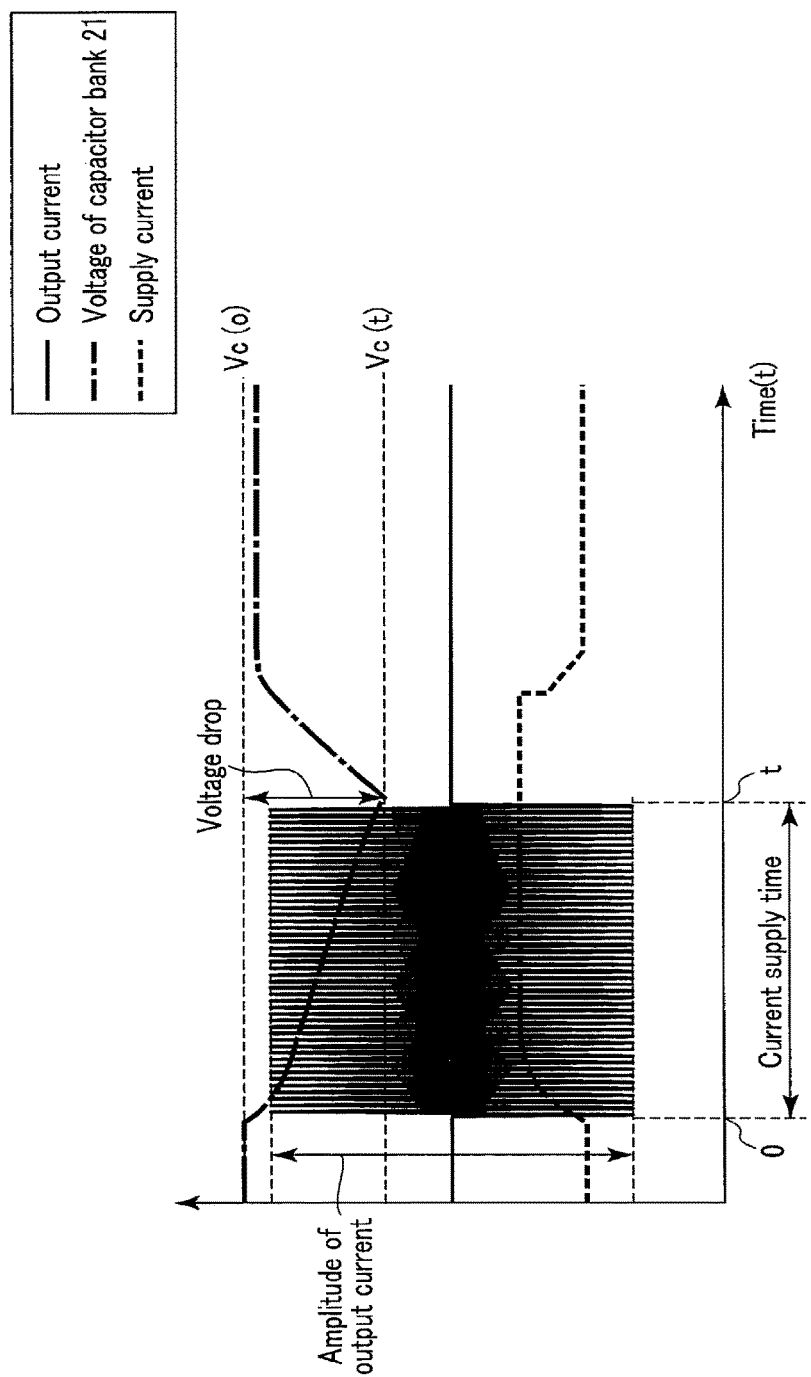
F I G. 5

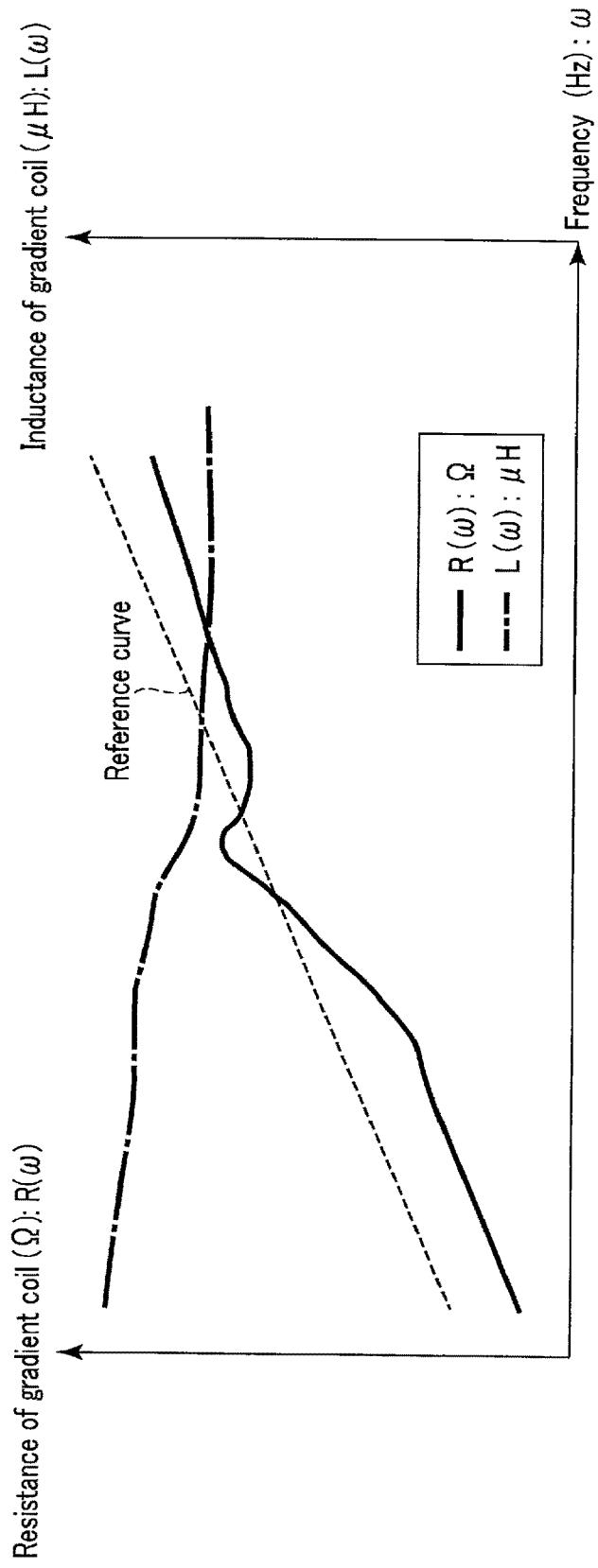
F I G. 9

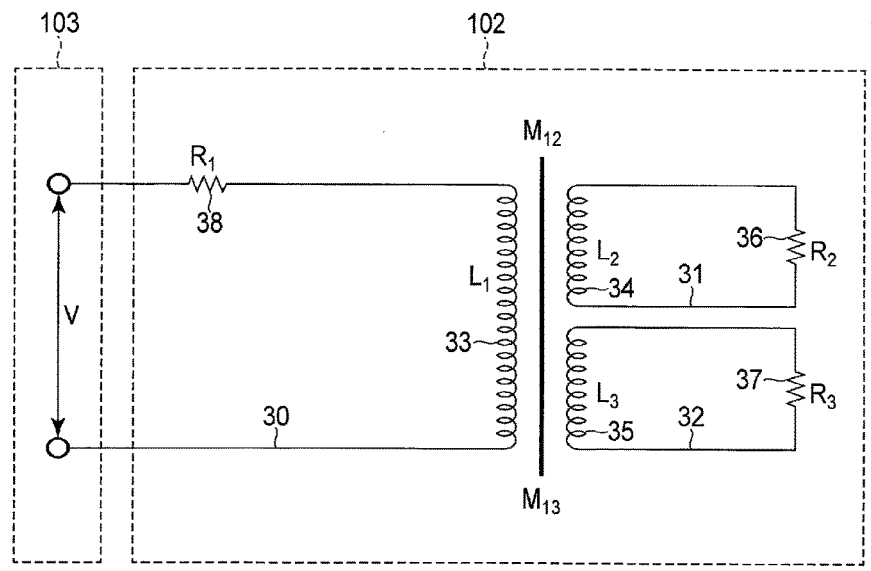
F I G. 10
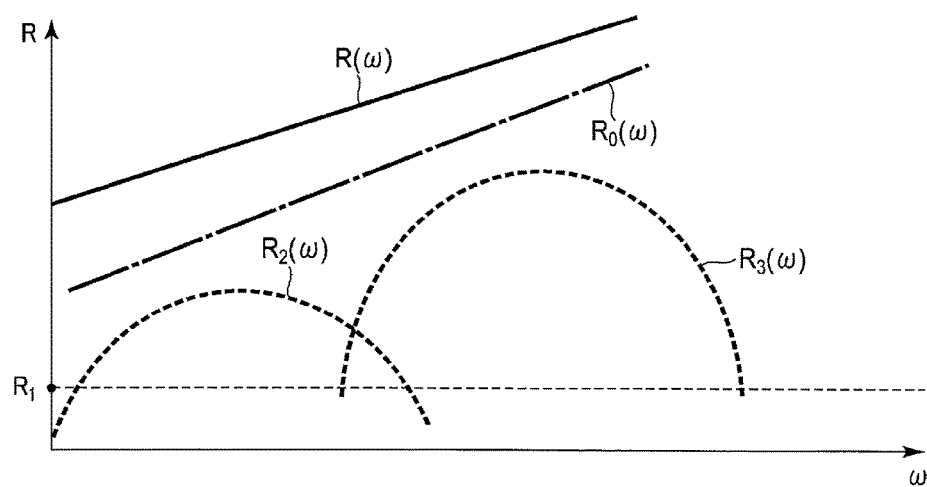
F I G. 11

MAGNETIC RESONANCE IMAGING APPARATUS

CROSS-REFERENCE TO RELATED APPLICATION

This application is based upon and claims the benefit of priority from the prior Japanese Patent Application No. 2015-246584, filed Dec. 17, 2015, the entire contents of which are incorporated herein by reference.

FIELD

Embodiments described herein relate generally to a magnetic resonance imaging apparatus.

BACKGROUND

Due to performance degradation (aged deterioration, etc.) of a gradient coil, the impedance within the gradient coil increases. As a result, there may occur a case in which the normal function of the gradient coil cannot be exhibited. Since there is no function of early detecting a change in impedance of the gradient coil, it is not possible to notice abnormality of the gradient coil, unless the performance degradation of the gradient coil is detected from an obvious problem of a magnetic resonance imaging apparatus, for example, degradation in image quality or an output error of a gradient magnetic field power supply.

Specifically, there is problem that a length of time is needed until detecting the abnormality of the gradient coil. In addition, as regards the setting of the imaging condition, there is a problem that the power design has excessively high specifications if a power margin is given to the gradient magnetic field power supply, in addition to a change with time of the impedance of the gradient coil.

BRIEF DESCRIPTION OF THE DRAWINGS

FIG. 5 is a view relating to the embodiment, FIG. 5 illustrating an example of a voltage $V_c$ of a capacitor bank, a supply current $I_p$ and an output current I during a current supply time.

FIG. 9 is a view relating to the embodiment, FIG. 9 illustrating an example of a graph relating to whether a magnetic resonance imaging can be executed in a judgement function of processing circuitry.

FIG. 10 is a view relating to the embodiment, FIG. 10 illustrating an example of a circuitry model (equivalent circuitry) relating to the gradient coil.

FIG. 11 is a view relating to the embodiment, FIG. 11 illustrating a resistance-frequency curve $R(\omega)$ calculated by a calculation function and a parameter-resistance curve $R_0(\omega)$ stored in storage circuitry, together with three resistances (offset resistance $R_{offset}$, low-frequency resistance $R_L(\omega)$ and high-frequency resistance $R_H(\omega)$) which contribute to the parameter-resistance curve $R_0(\omega)$.

DETAILED DESCRIPTION

Figure 1:
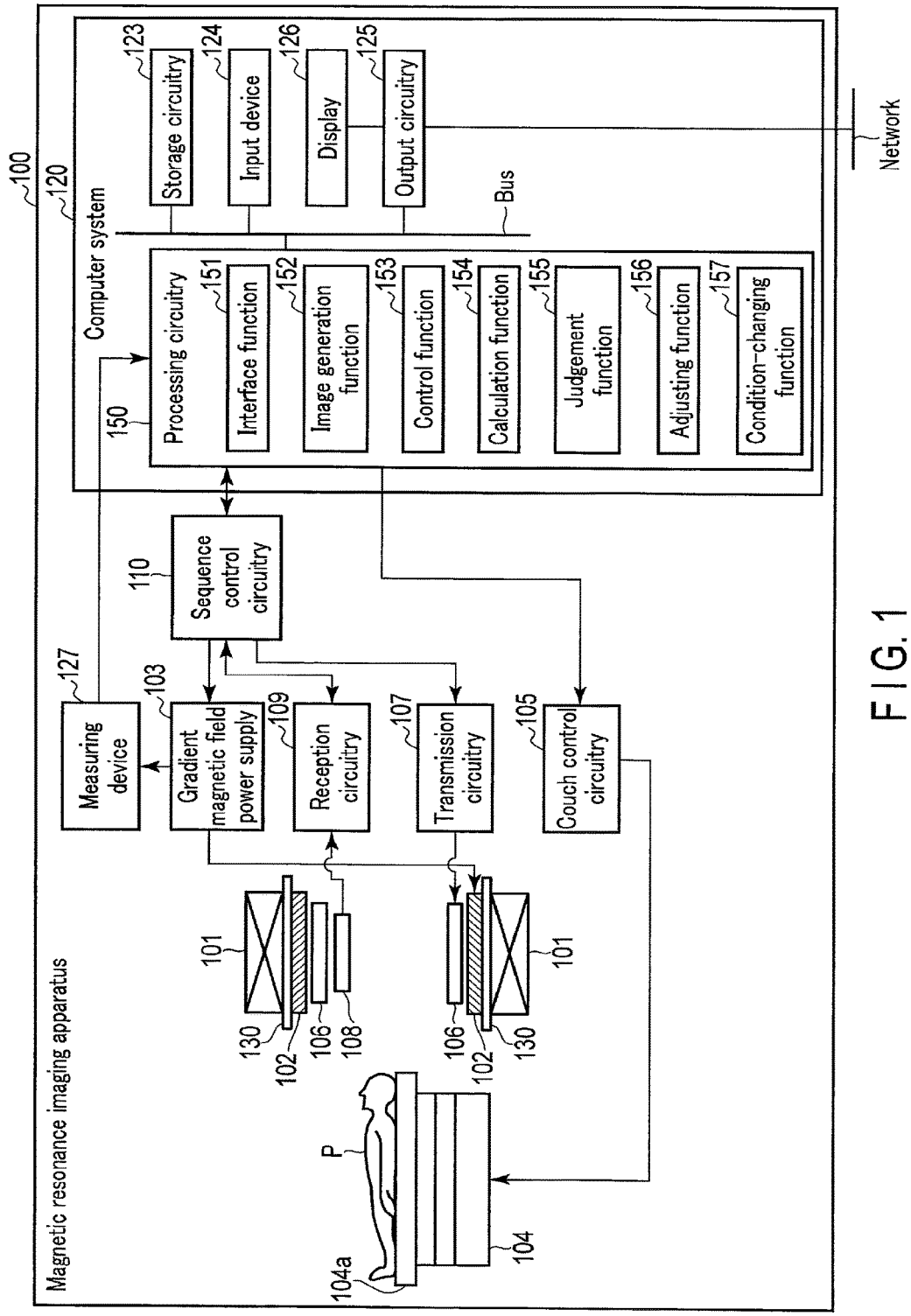
FIG. 1 is a block diagram illustrating an example of the configuration of a magnetic resonance imaging apparatus according an embodiment.

In general, according to one embodiment, a magnetic resonance imaging apparatus includes a gradient magnetic field power supply, a voltmeter, and processing circuitry. The gradient magnetic field power supply includes an amplifier, a power supply device, and a capacitor bank. The amplifier amplifies an input signal based on information of a gradient magnetic field waveform and outputs the amplified input signal to a gradient coil. The power supply device supplies power to the amplifier. The capacitor bank supplies power, together with the power supply device, to the amplifier. The voltmeter measures a voltage of the capacitor bank. The processing circuitry calculates frequency characteristics of an impedance of the gradient coil, based on a voltage variation of the capacitor bank which was measured by the voltmeter, and controls imaging in accordance with the calculated frequency characteristics.

Hereinafter, a magnetic resonance imaging apparatus according to an embodiment will be described in detail with reference to the accompanying drawings. In the description below, structural elements having substantially the same function and structure are denoted by like reference numerals, and an overlapping description is given only where necessary.

Referring to FIG. 1, a description is given of the entire configuration of a magnetic resonance imaging apparatus 100 according the embodiment. FIG. 1 is a block diagram illustrating the configuration of the magnetic resonance imaging apparatus 100 according the embodiment.

As illustrated in FIG. 1, the magnetic resonance imaging apparatus 100 includes a static-field magnet 101, a shim coil 130, a gradient coil 102, a gradient magnetic field power supply 103, a couch 104, couch control circuitry 105, a transmission coil 106, transmission circuitry 107, a reception coil 108, reception circuitry 109, sequence control circuitry 110, a computer system 120, and a measuring device 127. Incidentally, a subject P (e.g. a human body) is not included in the magnetic resonance imaging apparatus 100.

The static-field magnet 101 is a magnet formed in a hollow cylindrical shape, and generates a uniform static field in the inside space. The static-field magnet 101 is, for example, a permanent magnet, a superconducting magnet, or a resistive magnet.

The shim coil 130 is a coil which is formed in a hollow cylindrical shape in the inside of the static-field magnet 101. The shim coil 130 is connected to a shim coil power supply (not shown). Using power supplied from the shim coil power supply, the shim coil 130 uniformizes the static field which the static-field magnet 101 generates.

Figure 2:
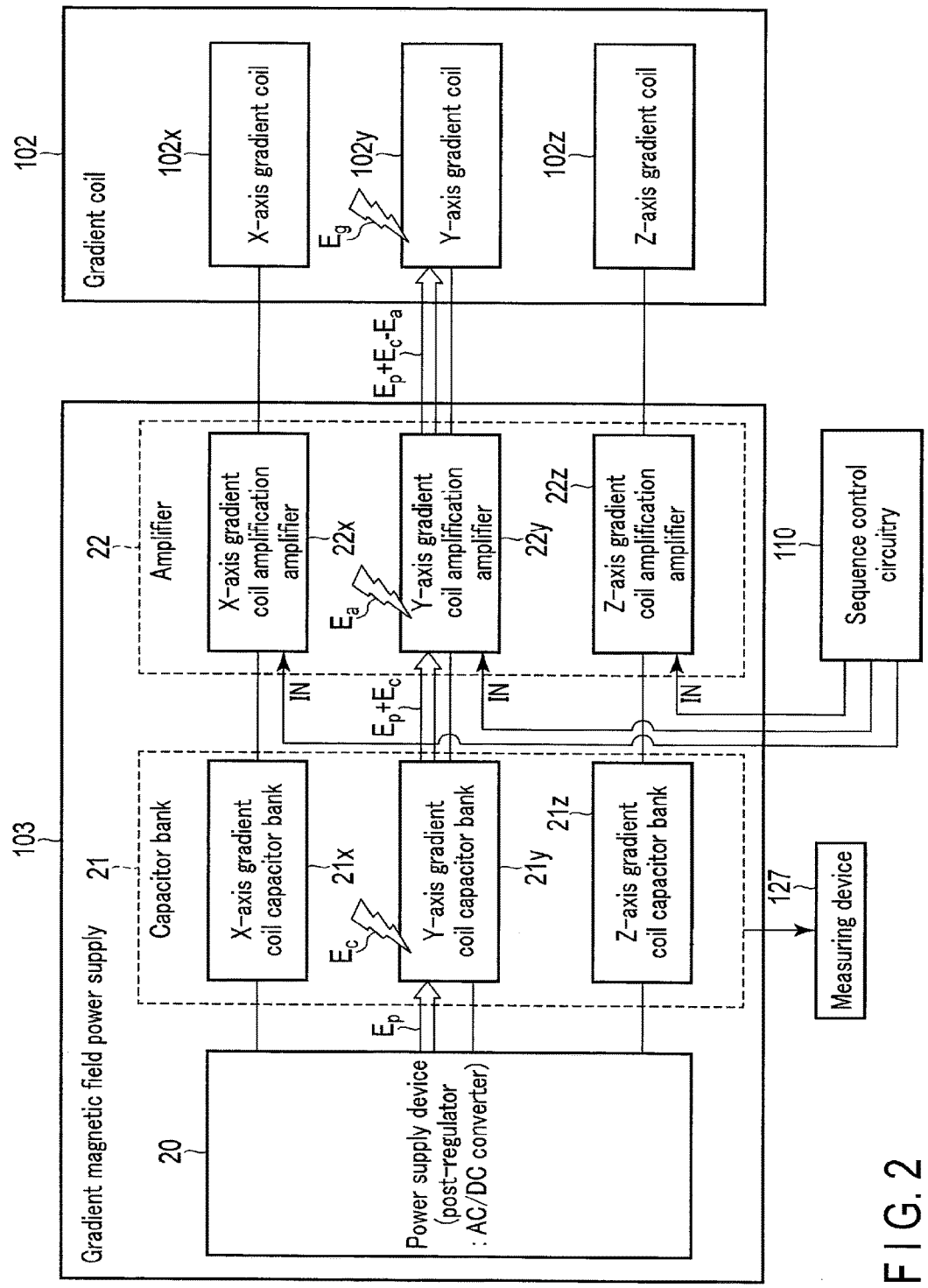
FIG. 2 is a block diagram illustrating an example of the configuration of a gradient magnetic field power supply, etc. according to the embodiment.

The gradient coil 102 is a coil formed in a hollow cylindrical shape, and is disposed in the inside of the static-field magnet 101 and shim coil 130. As illustrated in FIG. 2, the gradient coil 102 is formed by combining three coils (X-axis gradient coil 102x, Y-axis gradient coil 102y and Z-axis gradient coil 102z) corresponding to X-, Y- and Z-axes which are orthogonal to each other. These three coils individually receive currents from the gradient magnetic field power supply 103, and generate gradient magnetic fields having field intensities varying along the X-, Y- and Z-axes. Incidentally, a Z-axis direction is identical to the direction of the static field. In addition, a Y-axis direction is a vertical direction, and an X-axis direction is a direction perpendicular to the Z-axis and Y-axis.

In the meantime, the gradient magnetic fields of the X-, Y- and Z-axes, which are generated by the gradient coil 102, constitute, for example, a slice selection gradient magnetic field Gs, a phase encode gradient magnetic field Ge, and a read-out gradient magnetic field Gr. The slice selection gradient magnetic field Gs is utilized in order to arbitrarily determine an imaging cross section. The phase encode gradient magnetic field Ge is utilized in order to vary the phase of an MR signal in accordance with a spatial position. The read-out gradient magnetic field Gr is utilized in order to vary the frequency of the MR signal in accordance with a spatial position.

The gradient magnetic field power supply 103 supplies current to the gradient coil 102. The configuration of the gradient magnetic field power supply 103 will be described later with reference to FIG. 2.

The couch 104 includes a couch top 104a on which the subject P is placed. Under the control of the couch control circuitry 105, the couch top 104a in a state in which the subject P is placed thereon is inserted into a cavity (imaging port) of the gradient coil 102. Normally, the couch 104 is disposed such that the longitudinal direction of the couch 104 is parallel to the center axis of the static-field magnet 101. The couch control circuitry 105 drives the couch 104 under the control by the computer system 120. Thereby, the couch top 104a moves in the longitudinal direction and in the up-and-down direction.

The transmission coil 106 is disposed in the inside of the gradient coil 102. The transmission coil 106 receives RF (Radio Frequency) pulses which are supplied from the transmission circuitry 107, and generates a high-frequency magnetic field. The transmission circuitry 107 supplies to the transmission coil 106 the RF pulses corresponding to a Larmor frequency which is determined by the kind of atomic nucleus that is a target, and the intensity of the magnetic field.

The reception coil 108 is disposed in the inside of the gradient coil 102, and receives an MR (Magnetic Resonance) signal which is emitted from the subject P by the influence of the high-frequency magnetic field. Upon receiving the MR signal, the reception coil 108 outputs the received MR signal to the reception circuitry 109. For example, the reception coil 108 is a coil array including one or more coil elements, typically a plurality of coil elements.

The reception circuitry 109 generates MR data, based on the MR signal which is output from the reception coil 108. Specifically, the reception circuitry 109 subjects the MR signal, which is output from the reception coil 108, to various signal processes such as pre-amplification, intermediate frequency conversion, phase detection, low-frequency amplification, and filtering. Then, the reception circuitry 109 analog/digital converts the data which was subjected to the various signal processes. Thereby, the reception circuitry 109 generates the MR data which is digitized complex data. The MR data, which the reception circuitry 109 generated, is also called "raw data".

In addition, the reception circuitry 109 transmits the generated MR data to the sequence control circuitry 110. Incidentally, the reception circuitry 109 may be provided on a gantry side including the static-field magnet 101, gradient coil 102, etc.

Here, in this embodiment, the MR signals, which are output from the respective coil elements of the reception coil 108, are properly distributed and combined, and are thereby output to the reception circuitry 109 by a unit called "channel", etc. Thus, the MR data is handled in units of a channel in processes of rear stages of the reception circuitry 109.

As regards the relationship between the total number of coil elements and the total number of channels, there is a case in which the total number of coil elements and the total number of channels are equal, or a case in which the total number of channels is less than the total number of coil elements, or a case in which the total number of channels is, conversely, greater than the total number of coil elements. In the meantime, the timing of distribution/combining is not limited to the above-described timing. It should suffice if the MR signal or MR data is distributed/combined in units of a channel, before the process by an image generation function 152 (to be described later).

Based on the information of an imaging sequence which is transmitted from the computer system 120, the sequence control circuitry 110 drives the gradient magnetic field power supply 103, transmission circuitry 107 and reception circuitry 109, and carries out imaging on the subject P.

The imaging sequence means a pulse sequence corresponding to each of a plurality of protocols included in tests by the magnetic resonance imaging apparatus 100. In the information of the imaging sequence, the following, for instance, are defined: the intensity of power which the gradient magnetic field power supply 103 supplies to the gradient coil 102; the timing of supplying the power; the intensity of an RF pulse which the transmission circuitry 107 transmits to the transmission coil 106; the timing of applying the RF pulse; and the timing at which the reception circuitry 109 detects the MR signal.

In the meantime, the sequence control circuitry 110 drives the gradient magnetic field power supply 103, transmission circuitry 107, reception circuitry 109 and shim coil power supply, and images the subject P. As a result, if the sequence control circuitry 110 receives the MR data from the reception circuitry 109, the sequence control circuitry 110 transfers the MR data to the computer system 120. The sequence control circuitry 110 is an example of a sequence controller.

The computer system 120 executes overall control of the magnetic resonance imaging apparatus 100, data collection, image generation, etc. The computer system 120 includes processing circuitry 150, storage circuitry 123, an input device 124, output circuitry 125, and a display 126. In addition, the processing circuitry 150 includes an interface function 151, an image generation function 152, a control function 153, a calculation function 154, a judgement function 155, an adjusting function 156, and a condition-changing function 157.

In the present embodiment, the respective processing functions, which are executed by the interface function 151, image generation function 152, control function 153, calculation function 154, judgement function 155, adjusting function 156 and condition-changing function 157, are stored in the storage circuitry 123 in the form of computer-executable programs. The processing circuitry 150 is a processor which reads out the programs from the storage circuitry 123, and executes the programs, thereby realizing the functions corresponding to the respective programs. In other words, the processing circuitry 150 in the state in which the processing circuitry 150 has read out the programs includes the respective functions illustrated in the processing circuitry 150 in FIG. 1.

In the meantime, in FIG. 1, the description was given on the assumption that the processing functions, which are executed by the interface function 151, image generation function 152, control function 153, calculation function 154, judgement function 155, adjusting function 156 and condition-changing function 157, are realized by the single processing circuitry 150. However, the processing circuitry 150 may be constituted by combining a plurality of independent processors, and the respective processors may realize the functions by executing the programs.

In other words, there may be either a case in which the above-described functions are composed as programs and the single processing circuitry executes the respective programs, or a case in which a specific function is implemented in independent purpose-specific program-executing circuitry. Incidentally, the interface function 151, image generation function 152, control function 153, calculation function 154, judgement function 155, adjusting function 156 and condition-changing function 157, which are included in the processing circuitry 150, are examples of an interface unit, an image generator, a controller, a calculator, a judgement unit, an adjusting unit, and a condition-changing unit, respectively.

The term "processor" used in the above description means, for example, a CPU (Central Processing Unit), a GPU (Graphics Processing Unit), or circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array)).

The processors realize the functions by reading out and executing the programs stored in the memory circuitry 123. In the meantime, instead of storing the programs in the memory circuitry 123, such a configuration may be adopted that the programs are directly incorporated in the circuitry in the processors. In this case, the processors realize the functions by reading out and executing the programs incorporated in the circuitry in the processors. Incidentally, the couch control circuitry 105, transmission circuitry 107, reception circuitry 109 and sequence control circuitry 110 are similarly composed of electronic circuitry such as the above-described processors.

The processing circuitry 150 transmits, by the interface function 151, the information of the imaging sequence to the sequence control circuitry 110, and receives the MR data from the sequence control circuitry 110. In addition, if the processing circuitry 150 receives the MR data through the interface function 151, the processing circuitry 150 stores the received MR data in the storage circuitry 123.

The processing circuitry 150 generates images by the image generation function 152, by using the MR data received through the interface function 121, and the data stored in the storage circuitry 123. In the meantime, the processing circuitry 150 transmits, where necessary, the images obtained by the image generation function 152 to the display 126 or storage circuitry 123.

The processing circuitry 150 executes overall control of the magnetic resonance imaging apparatus 100 by the control function 153. For example, the processing circuitry 150 generates, by the control function 153, the information of the imaging sequence, based on an imaging condition which is input by an operator through the input device 124. The processing circuitry 150 controls, by the control function 153, the imaging by sending the generated information of the imaging sequence to the sequence control circuitry 110.

The processing circuitry 150 calculates, by the calculation function 154, the frequency dependency of the impedance in the gradient coil 102. The processing circuitry 150 judges, by the judgement function 155, whether the magnetic resonance imaging on the subject P can be executed, by using the calculated frequency dependency. The processing circuitry 150 executes predetermined control in accordance with the judgement result by the judgement function 155. The predetermined control is an interlock to the present magnetic resonance imaging apparatus 100. Specifically, when it is judged by the judgement function 155 that the magnetic resonance imaging cannot be executed, the control function 153 executes the interlock to the present magnetic resonance imaging apparatus 100.

In accordance with the judgement result by the judgement function 155, the processing circuitry 150 adjusts, by the adjusting function 156, a plurality of parameters corresponding to a plurality of circuitry elements in a circuitry model corresponding to the gradient coil 102. The plural parameters corresponding to the plural circuitry elements are, for example, a resistance value corresponding to a resistance element, a mutual inductance corresponding to two coils which interact magnetically, and a self-inductance in the coil itself. The processing circuitry 150 changes, by the condition-changing function 157, the preset imaging condition to an imaging condition corresponding to the calculated frequency dependency, by using the adjusted parameters. The calculation function 154, judgement function 155, adjusting function 156 and condition-changing function 157 are executed in accordance with the gradient coils corresponding to the X-axis, Y-axis and Z-axis. The calculation function 154, judgement function 155, adjusting function 156 and condition-changing function 157 will be described later in detail.

The storage circuitry 123 stores the MR data which the processing circuitry 150 received via the interface function 151, and the image data generated by the image generation function 152. For example, the storage circuitry 123 is a RAM (Random Access Memory), a semiconductor memory element such as a flash memory, a hard disk, an optical disc, etc. The storage circuitry 123 corresponds to a storage unit.

The storage circuitry 123 stores programs corresponding to the various functions which are executed by the processing circuitry 150. The storage circuitry 123 stores a relational expression relating to the energy conservation law with respect to the gradient magnetic field power supply 103 and gradient coil 102. This relational expression will be described later in detail. The storage circuitry 123 stores a plurality of parameters relating to the circuitry model of the gradient coil 102. The plural parameters will be described later in detail in the description of the adjusting function 156.

The storage circuitry 123 stores a curve (hereinafter referred to as "parameter-resistance curve") which indicates the frequency dependency of resistance in the gradient coil 102 and is determined by the plural parameters. In the meantime, the storage circuitry 123 may store a curve (hereinafter referred to as "parameter-impedance curve") which indicates the frequency dependency of impedance in the gradient coil 102 and is determined by the plural parameters. The plural parameters, parameter-resistance curve and parameter-impedance curve are updated by the adjusting function 156.

The storage circuitry 123 stores a plurality of reference values corresponding to a plurality of frequencies of an electric current which is supplied to the gradient coil 102. The plural reference values correspond to thresholds (hereinafter referred to as "error thresholds") for error judgement, which are used in the judgement function 155 that will be described later in detail. The plural reference values correspond to reference curves of the frequency dependency of the resistance value in the gradient coil 102. The reference curves are curves indicating error thresholds which are used in the judgement function 155.

The storage circuitry 123 stores imaging conditions relating to the magnetic resonance imaging. The imaging conditions depend on the stored plural parameters. The imaging conditions are, for example, the number of images to be captured per unit time, the resolution, the size of an effective field of view, etc. The resolution is, for example, the resolution in a slice direction, the resolution in a read-out direction, the resolution in a phase encode direction, etc.

The input device (input interface circuitry) 124 accepts various instructions and information inputs from the operator. The input device 124 is, for example, a pointing device such as a mouse or a trackball, or an input device such as a keyboard. The input device 124 inputs a start instruction of a function (hereinafter referred to as "change-with-time estimation function") for comprehensively executing the calculation function 154, judgement function 155, adjusting function 156 and condition-changing function 157.

Incidentally, the input device 124 is not limited to a device including a physical operation part, such as a keyboard. Examples of the input interface circuitry include processing circuitry of electric signals, which receives electric signals corresponding to an input operation from an external input device, which is provided separately from the magnetic resonance imaging apparatus 100, and outputs the received electric signals to various circuitry.

The output circuitry 125 causes the display 126 to display various kinds of information such as image data, under the control by the control function 153 in the processing circuitry 150. The display 126 is, for example, a display device such as a liquid crystal display.

When it is judged by the judgement function 155 in the processing circuitry 150 that the magnetic resonance imaging cannot be executed, the output circuitry 125 outputs a predetermined alert and a judgement result to, for example, an external service center via an in-hospital network and a predetermined gateway. Thereby, the predetermined alert and judgement result are reported to a maintenance provider, a serviceman, etc.

In the meantime, the output circuitry 125 may output the predetermined alert to the display 126, a speaker (not shown), etc. At this time, the display 126 displays the predetermined alert. In addition, the speaker produces the predetermined alert as sound, under the control by the processing circuitry 150. The predetermined alert is an alert relating to the impossibility of magnetic resonance imaging, the suspension of use of the present magnetic resonance imaging apparatus 100, or the execution of an interlock to the magnetic resonance imaging apparatus 100. Thereby, the predetermined alert is reported to an operator, an engineer, a maintenance provider, a serviceman, etc. The output circuitry 125 corresponds to an output unit.

The measuring device 127 measures a voltage (voltage value) of a capacitor bank 21 which is provided between a power supply device 20 and an amplifier 22 in the gradient magnetic field power supply 103. The measuring device 127 is, for example, a voltmeter which is provided in the capacitor bank 21. Specifically, when a plurality of AC currents with different frequencies were supplied to the gradient coil 102 during a predetermined time interval (hereinafter referred to as "current supply time"), the measuring device 127 measures a voltage (hereinafter referred to as "drop voltage") of the capacitor bank 21 after a drop of voltage during the current supply time. The measuring device 127 outputs the drop voltage for each frequency to the processing circuitry 150. Incidentally, the measuring device 127 is not limited to the voltmeter, if it can measure the drop voltage.

The entire configuration of the magnetic resonance imaging apparatus 100 according to the embodiment has been described above. Next; referring to FIG. 2, a process, in which the gradient magnetic field power supply 103 supplies an electric current to the gradient coil 102, is described. FIG. 2 is a block diagram illustrating the configuration of the gradient magnetic field power supply 103, etc. according to a first embodiment. Incidentally, the gradient magnetic field power supply 103 may include a current detection coil and an error amplifier, which are not illustrated in FIG. 2. The operations of the current detection coil and error amplifier will be described later in detail.

As illustrated in FIG. 2, for example, the gradient magnetic field power supply 103 includes a power supply device (post-regulator) 20, a capacitor bank 21 (X-axis gradient coil capacitor bank 21$x$, Y-axis gradient coil capacitor bank 21$y$ and Z-axis gradient coil capacitor bank 21$z$), and an amplifier (power stage: X-axis gradient coil amplification amplifier 22$x$, Y-axis gradient coil amplification amplifier 22$y$, and Z-axis gradient coil amplification amplifier 22$z$).

The power supply device 20 is a device having a function of a power supply which supplies energy to the amplification amplifiers 22$x$ to 22$z$ (to be described later). The power supply device 20 supplies energy, which the amplification amplifiers 22$x$ to 22$z$ require, to the amplification amplifiers 22$x$ to 22$z$ in accordance with the operations of the amplification amplifiers 22$x$ to 22$z$. A concrete example of the power supply device 20 is a predetermined DC power supply (AC/DC converter) which rectifies, for example, an alternating current that is output from an AC power supply. The AC/DC converter 20 converts an alternating current in an external power supply to a direct current.

The power supply device 20 is, for example, a DC power supply having CV (Constant Voltage)/CC (Constant Current) characteristics. In this case, the power supply device 20 functions as a constant current source when the load of the rear state is large, and functions as a constant voltage source when the load of the rear stage is, conversely, small. However, in the situation to be described in the embodiment below, since the load of the rear stage is large, the power supply device 20 functions as the constant current power supply.

Figure 3:
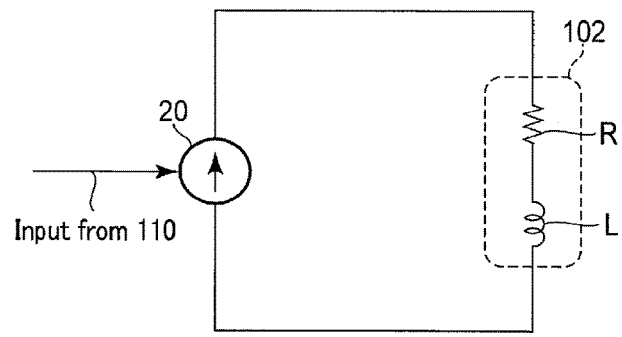
FIG. 3 is a view relating to the embodiment, FIG. 3 illustrating an example of schematic circuitry relating to a gradient coil.

FIG. 3 is a view illustrating an example of schematic circuitry relating to the gradient coil 102. As illustrated in FIG. 3, the power supply device 20 corresponds to a constant current source. The constant current source 20 supplies an electric current to the gradient coil 102 in accordance with an input from the sequence control circuitry 110. The gradient coil 102 includes, for example, a resistor R and a coil L.

The capacitor bank 21 supplies power (applies a voltage), together with the power supply device 20, to the amplifier 22. Specifically, the X-axis gradient coil capacitor bank 21$x$, Y-axis gradient coil capacitor bank 21y and Z-axis gradient coil capacitor bank 21z are condensers functioning as batteries which compensate the power supply that cannot be completed by the power supply device 20.

The X-axis gradient coil capacitor bank 21x, Y-axis gradient coil capacitor bank 21y and Z-axis gradient coil capacitor bank 21z represent capacitor banks corresponding to the X-axis gradient coil 102x, Y-axis gradient coil 102y and Z-axis gradient coil 102z. A configuration example of each of the capacitor banks 21x to 21z is an electrolytic condenser. The capacitor banks 21x to 21z are connected to the power supply device 20 and the corresponding amplification amplifiers 22x to 22z. The capacitor banks 21x to 21z temporarily store the incoming power from the power supply device 20, and discharge the stored power, when necessary, to the amplification amplifiers 22x to 22z.

Here, the function of the capacitor bank is as follows. Specifically, when it becomes necessary to pass large currents in a short time through the gradient coils 102x to 102z of all axes, there may be a case in which the necessary power supply amount temporarily exceeds the power that can be supplied by the power supply device 20. Even in such a case, by virtue of the presence of the capacitor banks 21x to 21z, power can be stably supplied to the gradient coils 102x to 102z.

Each of the amplification amplifiers 22x to 22z is the amplifier 22 which converts a sequence waveform to large-current pulses. The amplifier 22 amplifies an input signal based on the information of the gradient magnetic field waveform, and outputs the amplified input signal to the gradient coil 102. Specifically, the X-axis gradient coil amplification amplifier 22x, Y-axis gradient coil amplification amplifier 22y and Z-axis gradient coil amplification amplifier 22z are amplifiers 22 corresponding to the X-axis gradient coil 102x, Y-axis gradient coil 102y and Z-axis gradient coil 102z. The amplification amplifiers 22x to 22z receive control signals corresponding to the sequence waveform from the sequence control circuitry 110, convert the received control signals to large-current pulses, and output the large-current pulses to the gradient coil 102.

As described above, the gradient magnetic field power supply 103 supplies the current, which is necessary for executing the imaging sequence, to the gradient coil 102. Next, the function of the gradient magnetic field power supply 103 will be described in greater detail.

Figure 4:
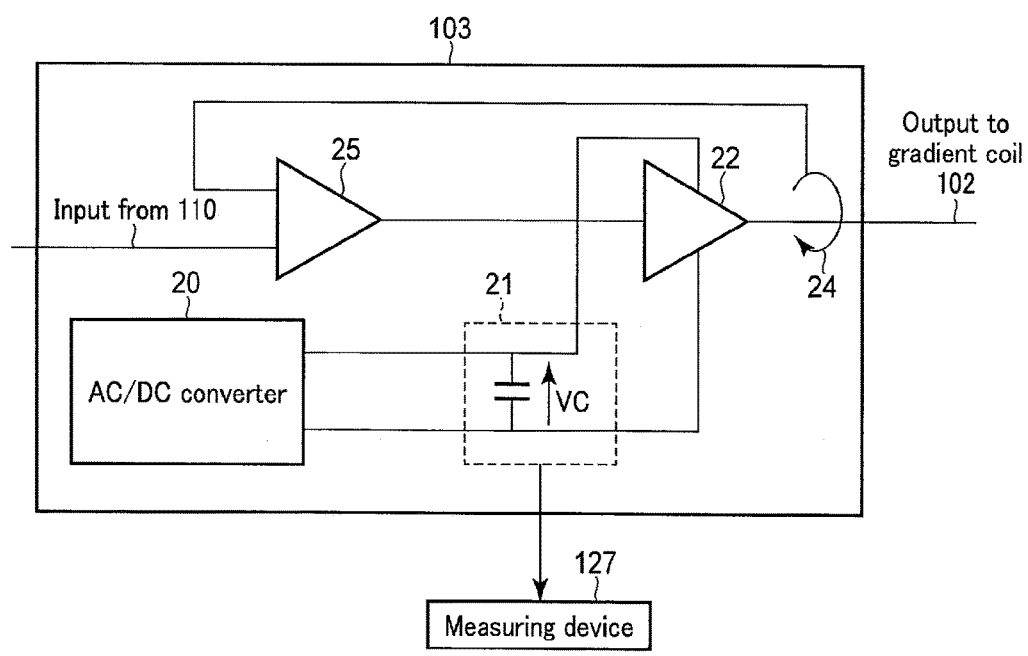
FIG. 4 is a view illustrating an example of circuitry configuration in the gradient magnetic field power supply according to the embodiment.

FIG. 4 is a view illustrating an example of the circuitry configuration in the gradient magnetic field power supply 103. The gradient magnetic field power supply 103 has a circuitry configuration illustrated in FIG. 4 with respect to each of the X-axis, Y-axis and Z-axis. As illustrated in FIG. 4, the gradient magnetic field power supply 103 further includes a current detector 24 and an error amplifier 25. The gradient magnetic field power supply 103 receives a waveform of an input signal (hereinafter referred to as "input signal waveform") which is input from the sequence control circuitry 110. The gradient magnetic field power supply 103 outputs to the gradient coil 102 an electric current (hereinafter referred to as "output current") having a waveform corresponding to the input signal waveform. If the waveform of the output current (hereinafter referred to as "current waveform"), which is output from the gradient magnetic field power supply 103, is supplied to the gradient coil 102, the gradient coil 102 generates a gradient magnetic field, which is substantially identical in shape to the current waveform, to the imaging region in the gantry apparatus.

The current detector 24 detects the current waveform of the output current which was supplied from the amplifier 22 to the gradient coil 102. The current detector 24 outputs the detected current waveform to the error amplifier 25. In FIG. 4, although the current detector 24 is depicted as a coil (current detection coil), the current detector 24 is not limited to the coil. The current detector 24 may be a current detector of other configuration, if it can detect the current waveform.

The error amplifier 25 receives the input signal waveform which is input from the sequence control circuitry 110. As illustrated in FIG. 4, the error amplifier 25 corresponds to, for example, an OP (Operational) amplifier (operational amplifier) in feedback control circuitry. The error amplifier 25 compares the input signal waveform and the current waveform. At this time, the error amplifier 25 functions as a comparator (e.g. differential amplification circuitry). Based on the difference between the input signal waveform and the current waveform, the error amplifier 25 outputs an error signal to the amplifier 22.

The amplifier 22 amplifies the error signal to a large current. At this time, the amplified large current has a current waveform which substantially agrees with the input signal waveform. Specifically, the amplifier 22 generates a current waveform corresponding to the gradient magnetic field waveform. The amplifier 22 outputs the amplified large current to the gradient coil 102. The power supply voltage, which is applied to the amplifier 22, is a DC voltage generated by the AC/DC converter 20. The current detector 24 and error amplifier 25 are provided for each of the gradient coils corresponding to the respective axes. Thereby, since negative feedback of the output current is executed by the current detector 24, feedback control using the input signal waveform and the current waveform of the output current can be executed for the output current.

As illustrated in FIG. 2 and FIG. 4, the capacitor bank 21 is provided between the AC/DC converter 20 and the amplifier 22. The capacitor bank 21 is connected in parallel to the output from the AC/DC converter 20. The capacitor bank 21 supplies power, together with the AC/DC converter 20, to the gradient coil 102. By the capacitor bank 21, the gradient magnetic field power supply 103 can temporarily supply a large current to the gradient coil 102. Hereinafter, the control relating to this temporary large-current supply by the gradient magnetic field power supply 103 is referred to as "current control".

In a case in which the impedance (e.g. resistance) of the gradient coil 102 is higher than a predetermined value due to, for example, an individual defect (or performance degradation) of the gradient coil 102, the gradient coil 102 additionally consumes energy. Thereby, the gradient coil 102 having a higher impedance than a predetermined value becomes factors of image quality degradation and damages to the gradient magnetic field power supply 103 and to the gradient coil 102 itself.

In addition, even when the impedance has further increased, the above-described current control functions in the gradient magnetic field power supply 103. Thus, the gradient magnetic field power supply 103 tries to output to the gradient coil 102 the current having the current waveform which conforms to the input signal waveform, by increasing the output voltage to the amplifier 22. As a result, if the impedance of the gradient coil 102 increases, the energy that is applied to the gradient coil 102 also increases, and further damages will be caused.

Hereinafter, a description is given of the configuration relating to the estimation of the impedance (resistance) of the gradient coil 102, by which to avoid in advance the above-described damages and image quality degradation according to the magnetic resonance imaging apparatus 100 of the embodiment.

To begin with, the background relating to the magnetic resonance imaging apparatus 100 according to the embodiment is described. The energy balance in the gradient magnetic field generation system including the gradient magnetic field power supply 103 and gradient coil 102 is expressed by the following equation (1).

$$E_a + E_g = E_c + E_p \tag{1}$$

Here, $E_a$ is consumption energy which is consumed in each of the X-axis gradient coil amplification amplifier 22x, Y-axis gradient coil amplification amplifier 22y and Z-axis gradient coil amplification amplifier 22z. $E_g$ is consumption energy which is consumed in each of the X-axis gradient coil 102x, Y-axis gradient coil 102y and Z-axis gradient coil 102z. $E_c$ is energy which was supplied from each of the X-axis gradient coil capacitor bank 21x, Y-axis gradient coil capacitor bank 21y and Z-axis gradient coil capacitor bank 21z to each of the X-axis gradient coil 102x, Y-axis gradient coil 102y and Z-axis gradient coil 102z. $E_p$ is energy which was supplied from the power supply device 20 to each of the X-axis gradient coil 102x, Y-axis gradient coil 102y and Z-axis gradient coil 102z.

Equation (1) represents such a relational expression of energy conservation law that, in the gradient magnetic field generation system, the supplied energy and the consumed energy become equal in the gradient coils relating to the respective axes. For example, as illustrated in FIG. 2, the relational expression (1) of energy conservation law is established for each of the axes. $E_a$ in FIG. 2 indicates the consumption energy which is consumed in the Y-axis gradient coil amplification amplifier 22y. $E_g$ in FIG. 2 indicates the consumption energy which is consumed in the Y-axis gradient coil 102y. $E_c$ in FIG. 2 indicates the energy which was supplied from the Y-axis gradient coil capacitor bank 21y to the Y-axis gradient coil 102y. $E_p$ in FIG. 2 indicates the energy which was supplied from the power supply device 20 to the Y-axis gradient coil 102y.

Specifically, equation (1) indicates that the sum of the consumption energy $E_a$ of the amplification amplifier 22 and the consumption energy $E_g$ of the gradient coil 102 is equal to the sum of the supply energy $E_p$ from the AC/DC converter 20 and the supply energy $E_c$ from the capacitor bank 21. From the relational expression (1) relating to the energy conservation law, the voltage of the capacitor 21 can be derived.

$E_c$ is concretely expressed by equation (2).

$$E_c = \tfrac{1}{2} C V_c(0)^2 - \tfrac{1}{2} C V_c(t)^2 \tag{2}$$

Here, C is an electrostatic capacitance of each of the X-axis gradient coil capacitor bank 21x, Y-axis gradient coil capacitor bank 21y and Z-axis gradient coil capacitor bank 21z. $V_c(t)$ represents a voltage at time instant t of each of the X-axis gradient coil capacitor bank 21x, Y-axis gradient coil capacitor bank 21y and Z-axis gradient coil capacitor bank 21z. $V_c(0)$ represents a voltage at t=0, i.e. in the initial state, of each of the X-axis gradient coil capacitor bank 21x, Y-axis gradient coil capacitor bank 21y and Z-axis gradient coil capacitor bank 21z.

$E_p$ is concretely expressed by equation (3).

$$E_p = \int_0^t V_c(t') I_p(t') dt' \tag{3}$$

Here, $I_p(t')$ represents a current value of current supplied from the power supply device 20 at time instant t'. In the embodiment below, the case is described in which the power supply device 20 operates such that the current value of supplied current becomes a predetermined value. Hereinafter, $I_p$ is referred to as "supply current".

In addition, $E_a$ is expressed, for example, by equation (4).

$$E_a = \int_0^t (\alpha I(t')^2 + \beta I(t') + \gamma) dt' \tag{4}$$

Here, I(t') represents a current value of current that is output from the amplification amplifier 22x, 22y, 22z at time instant t'. This represents, at the same time, a current value of current that is supplied to the gradient coil 102x, 102y, 102z. In addition, α, β and γ are predetermined parameters which are empirically calculated. Hereinafter, I(t) is referred to as "output current".

Specifically, each of the X-axis gradient coil amplification amplifier 22x, Y-axis gradient coil amplification amplifier 22y and Z-axis gradient coil amplification amplifier 22z is actually composed of complex circuitry. However, it can be considered that the total consumption energy thereof is ultimately related to the final output current I(t'). Such effects are expressed by, for example, coefficients α, β and γ. The coefficient γ is consumption energy (idling loss of amplifier 22) of each of the X-axis gradient coil amplification amplifier 22x, Y-axis gradient coil amplification amplifier 22y and Z-axis gradient coil amplification amplifier 22z at a time when the output current I(t') is 0.

The coefficient β is consumption energy (a loss due to diodes, transistors, etc. in the amplifier 22) of each of the X-axis gradient coil amplification amplifier 22x, Y-axis gradient coil amplification amplifier 22y and Z-axis gradient coil amplification amplifier 22z with respect to linear parts relative to the output current I(t'). The coefficient α is a coefficient (a resistance loss in the amplifier 22) calculated on the assumption that a quadratic nonlinear effect on the output current I(t') is dominant in the consumption energy of each of the X-axis gradient coil amplification amplifier 22x, Y-axis gradient coil amplification amplifier 22y and Z-axis gradient coil amplification amplifier 22z with respect to nonlinear parts relative to the output current I(t').

In addition, the output current I(t') corresponds to the waveform of the gradient magnetic field in the information of the imaging sequence. Conversely, if the waveform of the gradient magnetic field is determined, the output current I(t') is determined. Accordingly, when the imaging sequence has been determined, the output current I(t') becomes a known variable. In short, the output current I(t') is an AC current that is supplied to the gradient coil.

Besides, it is considered that $E_g$ can be written, for example, as a relational expression like equation (5).

$$E_g = \int_0^t f(R(\omega), I(t')) dt' \tag{5}$$

Here, R is a resistance of the gradient coil 102, and ω is a frequency of the AC current (output current I) that is supplied to the gradient coil 102. Specifically, the energy consumed by each of the X-axis gradient coil 102x, Y-axis gradient coil 102y and Z-axis gradient coil 102z is a value obtained by time-integrating a function f between the output current I(t') flowing in the gradient coil 102x, 102y, 102z at time instant t' and the resistance R(ω), over 0 to t, that is, during the current supply time during which current flows in the gradient coil. In addition, the consumption energy at time instant t' depends on the output current I(t'). The resistance R in equivalent circuitry of each of the X-axis gradient coil 102x, Y-axis gradient coil 102y and Z-axis gradient coil 102z depends on the frequency ω of the output current I(t').

On the background relating to the magnetic resonance imaging apparatus 100 according to this embodiment, the actual gradient coils 102x to 102z have complex electric and magnetic characteristics.

An example of such characteristics is a skin effect. Here, the skin effect refers to such an effect that when an AC current flows in a conductor, the current density is high on the surface of the conductor, and the current density becomes lower away from the surface of the conductor. When a high-frequency current flows in a conductor, the current is shut off and the current density lowers at a location away from the surface of the conductor, due to electromotive force resulting from the mutual inductance in the conductor. As a result, in the AC current, the current density concentrates in a shallow region of a surface depth or thereabout, and thus the electric resistance increases. Typically, as the skin effect, the electrical resistance of the AC current increases in proportion to the square of the frequency $\omega$.

Additionally, an example of such characteristics is a heat loss due to an eddy current. Here, the eddy current is an induction current occurring in a conductor due to a sudden change of a magnetic field. The eddy current occurring in the conductor is converted to Joule heat in the conductor, and causes the gradient coil 102 to produce heat.

From the above, the resistance R of the gradient coil 102 is not uniquely determined. Thus, the frequency characteristics of the resistance R of the gradient coil 102 are reproduced by the model of the equivalent circuitry of the gradient coil 102 illustrated in FIG. 3. Specifically, the consumption energy $E_g$ of the gradient coil 102 is expressed, for example, by the following equation.

$$E_g = \int_0^t \sqrt{R(\omega)^2 + (\omega L(\omega))^2} \, I(t')^2 dt' \quad (6)$$

$$= \sqrt{R(\omega)^2 + (\omega L(\omega))^2} \int_0^t I(t')^2 dt'$$

Using the above-described equations (1) to (6), a relational expression between the voltage of the capacitor bank 21 and the impedance of the gradient coil 102 can be derived like the following equation (7).

$$\sqrt{R(\omega)^2 + (\omega L(\omega))^2} = \frac{\frac{1}{2}CV_c(0)^2 - \frac{1}{2}CV_c(t')^2 + \int_0^t \{V_c(t')I_p(t') - (\alpha I(t')^2 + \beta I(t') + \gamma)\}dt'}{\int_0^t I(t')^2 dt'} \quad (7)$$

In equation (7), C, $\alpha$, $\beta$ and $\gamma$ are predetermined parameters, as described above, and are known quantities. In addition, the supply current $I_p(t)$ is a known quantity which is determined from the specifications of the power supply device 20. Besides, the output current I(t) is a known quantity which is determined in accordance with an AC current that is supplied to the gradient coil 102. Symbol $\omega$ is a known quantity which is determined in accordance with an AC current that is supplied to the gradient coil 102. Incidentally, the above equation (7) is established in association with the gradient coil 102 of each of the X-axis, Y-axis and Z-axis.

Additionally, L($\omega$) is an inductance in the gradient coil 102, and is a known quantity depending on the frequency $\omega$ of the output current I(t). L($\omega$) is prestored in the storage circuitry 123, for example, as a correspondence table (hereinafter referred to as "L($\omega$) correspondence table") of the induction to the frequency of the output current. In the meantime, the L($\omega$) correspondence table is stored in the storage circuitry 123 by being associated with each of the X-axis, Y-axis and Z-axis. The integration range, 0 to t, in equations (3) to (7) is the current supply time during which the output current is supplied to the gradient coil 102.

Additionally, the resistance R($\omega$) of the gradient coil 102 is expressed by the following equation (8) by solving the equation (7) with respect to R($\omega$).

$$R(\omega) = \sqrt{\left(\frac{\frac{1}{2}CV_c(0)^2 - \frac{1}{2}CV_c(t')^2 + \int_0^t \{V_c(t')I_p(t') - (\alpha I(t')^2 + \beta I(t') + \gamma)\}dt'}{\int_0^t I(t')^2 dt'}\right)^2 - (\omega L(\omega))^2} \quad (8)$$

Due to a change with time, that is, a secular change (aged deterioration), of the gradient coil 102, R($\omega$) varies with time. In equation (8), unknown variables are R($\omega$) and $V_c(t)$. Thus, if the voltage $V_c(t)$ at time instant t of the capacitor bank 21 in the output current I(t) of the frequency $\omega$ is measured by the measuring device 127 and the initial value of $V_c(t)$ at t=0 (hereinafter referred to as "initial voltage") is determined, the value of the resistance R($\omega$) can be calculated by using equation (8). Specifically, the value of the resistance R($\omega$) of the gradient coil of each of the X-axis, Y-axis and Z-axis is calculated by measuring the voltage $V_c(t)$ of the capacitor bank 21 of the gradient coil 102 of each of the X-axis, Y-axis and Z-axis.

It is assumed that the initial voltage $V_c(0)$ is stored in the storage circuitry 123. In the meantime, the initial voltage $V_c(0)$ may be measured by the measuring device 127. Specifically, the processing circuitry 150 can calculate (estimate), by the calculation function 154, the resistance R($\omega$) of the gradient coil corresponding to the frequency $\omega$, by using the measured drop voltage.

(Calculation Function)

Hereinafter, the calculation function 154, which is executed by the processing circuitry 150, is described.

If a start instruction of the change-with-time estimation function is input by the operator through the input device 124, the processing circuitry 150 reads out from the storage circuitry 123 the program (hereinafter referred to as "calculation program") relating to the calculation function 154 and the L($\omega$) correspondence table. In the meantime, the processing circuitry 150 may automatically read out the calculation program and the L($\omega$) correspondence table from the storage circuitry 123, for example, at a predetermined time instant before the first magnetic resonance imaging on the examination day when the magnetic resonance imaging is performed. The processing circuitry 150 develops the calculation program on its own memory, and executes the developed calculation program. At this time, the processing circuitry 150 functions as a calculation unit. The calculation unit calculates the frequency characteristics of the impedance of the gradient coil 102, based on a voltage variation of the capacitor bank 21 which is measured by the measuring device 127.

In the meantime, the time of execution of the calculation program is not limited to the examination day and a time before the first magnetic resonance imaging. The calculation program can be executed at an arbitrary date/time or at an arbitrary timing, which is set by the operator or maintenance provider. For example, the calculation program is executed in advance before the execution of magnetic resonance imaging for image generation relating to the subject P. The calculation program is a program relating to the following three operations or the like.

The first operation is an operation for supplying output currents I(t) corresponding a plurality of frequencies ω to the gradient coil 102, by controlling the sequence control circuitry 110 in accordance with the calculation program. The plural frequencies are, for example, two or three frequencies. In the calculation program, the plural frequencies ω and the current supply time are incorporated. In the first operation, the output currents I(t) are supplied to the gradient coils 102 for the respective frequencies during the current supply time.

In the meantime, the first operation may be executed for a gradient coil of each axis, or may be executed for a plurality of gradient coils. By replacing the technical terms in the following description with technical terms corresponding to each axis, the various functions, various processes and various operations relating to the gradient coil of each axis can properly be understood.

The second operation is an operation of measuring the drop voltage $V_c(t)$ of the capacitor bank 21 in the gradient magnetic field power supply 103 during the current supply time, by controlling the measuring device 127 according to the calculation program. During the current supply time, the measuring device 127 monitors the drop voltage $V_c(t)$ of the capacitor bank 21, thereby specifying a minimum value of the drop voltage $V_c(t)$.

The third operation is an operation of calculating the resistance of the gradient coil 102 by using the output current I(t), the frequency ω of the output current I(t), the drop voltage $V_c(t)$, the initial voltage $V_c(0)$, the value of the inductance L(ω) corresponding to the frequency ω, and the equation (8). For example, the processing circuitry 150 calculates the frequency characteristics of the impedance of the gradient coil 102, based on the voltage value of the capacitor bank 21. In the meantime, in the third operation, the processing circuitry 150 may calculate the impedance of the gradient coil 102 by using the equation (7) in place of the equation (8).

The processing circuitry 150 controls the gradient magnetic field power supply 103 via the sequence control circuitry 110 according to the calculation program. Specifically, the sequence control circuitry 110 supplies the AC current (output current) I(t) having the frequency ω to the amplifier 22 during the current supply time. The output current I(t) is, for example, a sine wave having the frequency ω, and, for example, $I(t)=I_0 \times \sin(\omega t)$. Here, $I_0$ is a value indicative of the amplitude of the output current I(t), and it is assumed that $I_0$ is constant in the third operation.

At this time, the measuring device 127 measures the drop voltage $V_c(t)$. The processing circuitry 150 reads out the value of the inductance L(ω) corresponding to the frequency ω from the storage circuitry 123. In addition, the processing circuitry 150 reads out the value of the supply current $I_p$, which is output from the AC/DC converter 20, from the storage circuitry 123.

FIG. 5 is a view illustrating an example of the voltage $V_c$ of the capacitor bank 21, the supply current $I_p$ and the output current I during the current supply time. As illustrated in FIG. 5, during the current supply time, the voltage of the capacitor bank 21 falls from the initial voltage $V_c(0)$ to the drop voltage $V_c(t)$. The amplitude of the output current in FIG. 5 corresponds to $I_0$.

The processing circuitry 150 calculates the value of the resistance R(ω) (hereinafter referred to as "resistance value") of the gradient coil 102 corresponding to the frequency ω, by substituting in the equation (8) the drop voltage $V_c(t)$, initial voltage $V_c(0)$, output current I(t), supply current $I_p(t)$, frequency ω, and inductance L(ω). By repeating the above process over a plurality of frequencies, the processing circuitry 150 calculates a plurality of resistance values corresponding to the plural frequencies.

In the meantime, the processing circuitry 150 may calculate a curve (hereinafter referred to as "resistance-frequency curve") indicating the frequency dependency of the resistance R(ω), by using the plural resistance values corresponding to the plural frequencies. At this time, the processing circuitry 150 monitors the voltage of the capacitor bank 21 with respect to each of output currents that are output to the gradient coils 102, and thereby generates the resistance-frequency curve.

Figure 6:
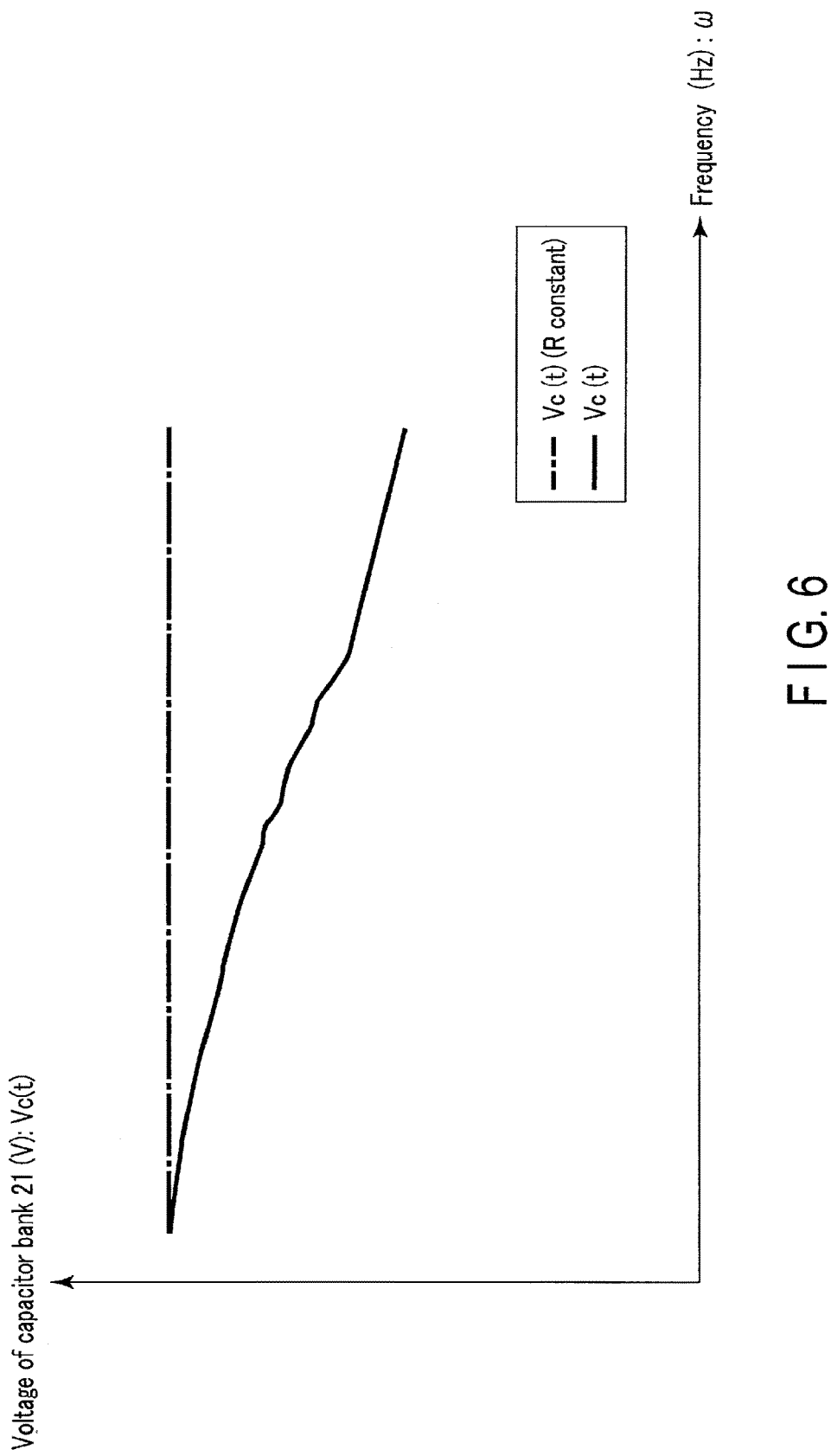
FIG. 6 is a view relating to the embodiment, FIG. 6 illustrating an example of the frequency dependency of a voltage $V_c(t)$ (R constant) of the capacitor bank and a drop voltage $V_c(t)$ in a case where the resistance of the gradient coil is assumed to be constant (frequency non-dependent).

FIG. 6 is a view illustrating an example of the frequency dependency of the voltage Vc(t) (R constant) of the capacitor bank 21 and the drop voltage $V_c(t)$ in a case where the resistance of the gradient coil 102 is assumed to be constant (frequency non-dependent). A dashed line in FIG. 6 indicates the frequency dependency of the voltage $V_c(t)$ (R constant) of the capacitor bank 21 in the case where the resistance of the gradient coil 102 is assumed to be constant. As illustrated in FIG. 6, when the resistance of the gradient coil 102 does not depend on the frequency, the voltage $V_c(t)$ (R constant) of the capacitor bank 21 takes a constant value, without depending on the frequency.

A solid line in FIG. 6 indicates the frequency dependency of the drop voltage $V_c(t)$ in the case where the resistance of the gradient coil 102 depends on the frequency. As illustrated in FIG. 6, since the drop voltage $V_c(t)$ that is the voltage of the capacitor bank 21 depends on the variation of the resistance in the gradient coil 102, the drop voltage $V_c(t)$ depends on the frequency ω of the output current I(t). The frequency dependency of the voltage $V_c(t)$ of the capacitor bank 21 is due to the fact that the drop voltage $V_c(t)$ is less susceptible to the influence of the inductor in the gradient coil. Therefore, as illustrated in FIG. 6, the variation of the resistance in the gradient coil 102 appears as the variation of the voltage $V_c(t)$ of the capacitor bank 21.

Figure 7:
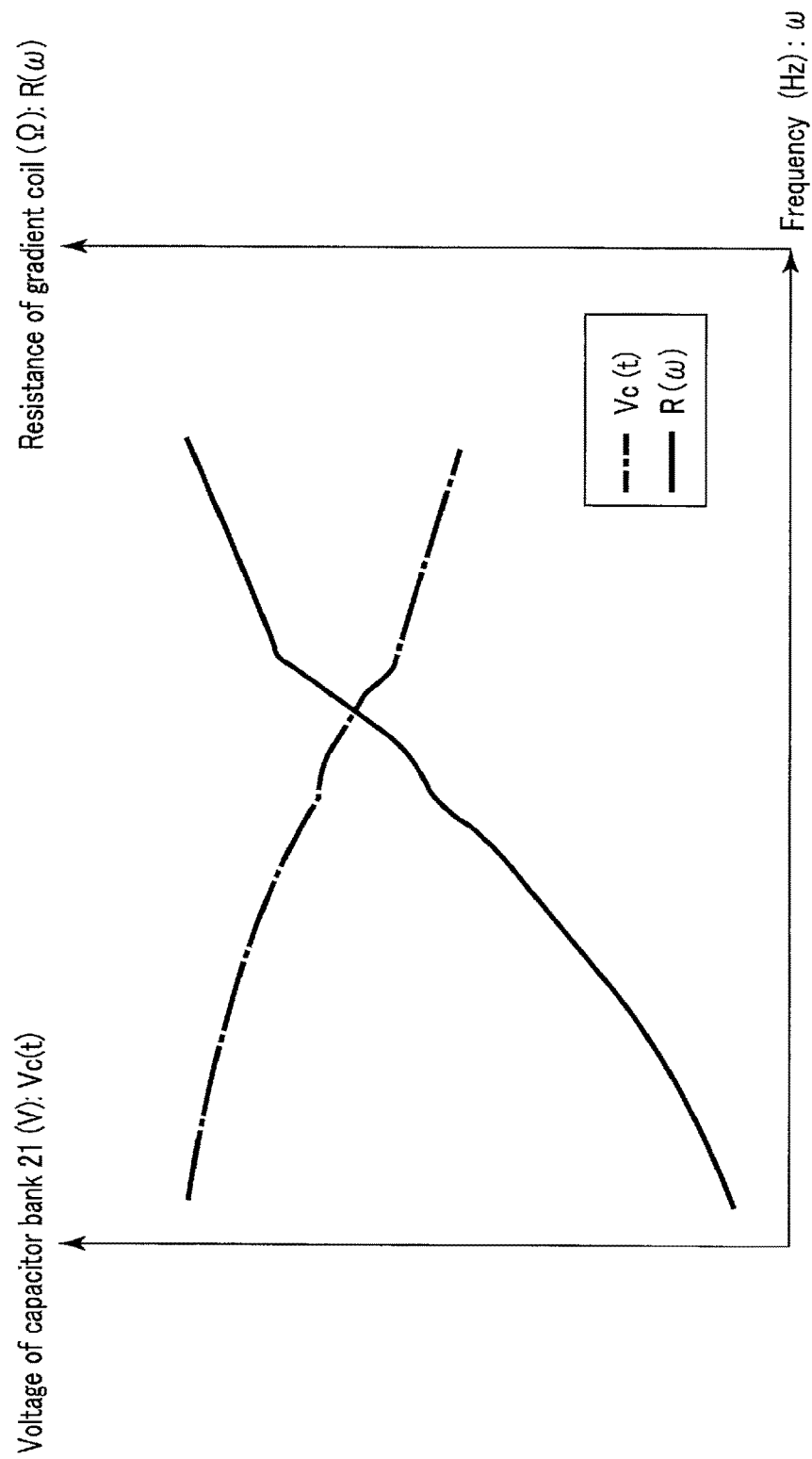
FIG. 7 is a view relating to the embodiment, FIG. 7 illustrating a relationship between the drop voltage $V_c(t)$ of the capacitor bank and a resistance $R(\omega)$ of the gradient coil, in relation to a frequency $\omega$ of the output current $I(t)$.

FIG. 7 is a view illustrating a relationship between the drop voltage $V_c(t)$ of the capacitor bank 21 and the resistance R(ω) of the gradient coil 102, in relation to the frequency ω of the output current I(t). A dashed line in FIG. 7 indicates the frequency dependency of the drop voltage $V_c(t)$ in the case of the solid line in FIG. 6, that is, in the case in which the resistance of the gradient coil 102 depends on the frequency.

A solid line in the graph of FIG. 7 indicates the frequency dependency of the resistance R(ω) of the gradient coil 102, that is, the resistance-frequency curve R(ω). As illustrated in FIG. 7, if the value of the frequency ω increases, the drop voltage $V_c(t)$ of the capacitor bank 21 decreases and the resistance R(ω) of the gradient coil 102 increases. In FIG. 7, although the initial voltage $V_c(0)$ is not illustrated, the initial voltage $V_c(0)$ is higher than the drop voltage $V_c(t)$ at any of the frequencies. Specifically, as regards any frequency ω, $V_c(0) > V_c(t)$.

As illustrated in FIG. 7, when the frequency of the output current I(t) is high, the heat production amount in the gradient coil 102 increases, and thus the resistance R(ω) increases. At this time, in order to cause a constant current to flow to the gradient coil 102, the voltage that is consumed in the capacitor bank 21 increases. Thus, the drop voltage $V_c(t)$ decreases in accordance with the increase of the frequency.

Figure 8:
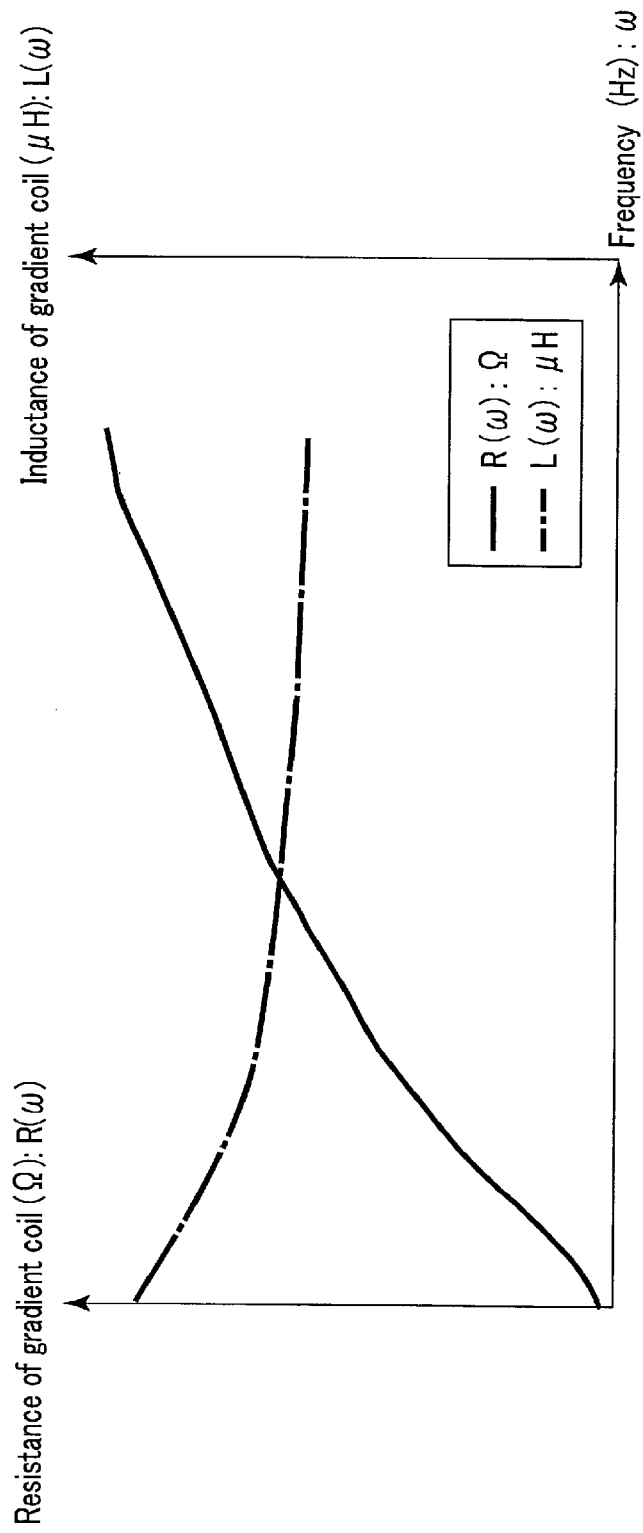
FIG. 8 is a view relating to the embodiment, FIG. 8 illustrating the frequency dependency of a resistance-frequency curve $R(\omega)$ and an inductance $L(\omega)$ in the gradient coil.

FIG. 8 is a view illustrating the frequency dependency of the resistance-frequency curve $R(\omega)$ and the inductance $L(\omega)$ in the gradient coil 102. A dashed line in the graph of FIG. 8 is a curve (hereinafter referred to as "inductance-frequency curve") indicating the frequency dependency of the inductance $L(\omega)$ in the gradient coil 102. A solid line in the graph of FIG. 8 shows a resistance-frequency curve.

The resistance-frequency curve in the graph of FIG. 8 shifts upward, that is, toward a higher resistance value, for example, in accordance with the aged deterioration of the gradient coil 102. At a time point when the magnetic resonance imaging apparatus 100 was installed in the examination room, the resistance-frequency curve is a curve in an upper rightward direction, which corresponds to the frequency, and has small values as a whole.

In the meantime, the impedance calculated by the processing circuitry 150 depends on the frequency. At this time, a curve indicating the impedance (hereinafter referred to as "impedance-frequency curve") can be calculated as follows. For example, a value, which is obtained by multiplying the inductance of the inductance-frequency curve in FIG. 8, the frequency and 1/1,000,000, and a resistance value of the resistance-frequency curve in FIG. 8, are squared and added for each frequency, and the resultant value is subjected to square root extraction.

(Judgement Function)

Hereinafter, the judgement function 155, which is executed by the processing circuitry 150, is described.

After the execution of the calculation function 154, the processing circuitry 150 reads out the program relating to the judgement function 155 (hereinafter referred to as "judgement program") from the storage circuitry 123. In addition, the processing circuitry 150 reads out from the storage circuitry 123 a plurality of reference values corresponding to the plural frequencies relating to the output current. The plural reference values are reference values relating to the resistance of the gradient coil 102.

The processing circuitry 150 develops the judgement program on its own memory, and executes the developed judgement program. At this time, the processing circuitry 150 functions as a judgement unit. The judgement unit judges whether the magnetic resonance imaging can be executed, by comparing the frequency characteristics and reference values. When the magnetic resonance imaging can be executed by changing the imaging condition, the judgement unit judges that the magnetic resonance imaging can be executed. The processing circuitry 150 compares the calculated plural resistance values and the read-out plural reference values with respect to each of the plural frequencies. When the resistance value exceeds the reference value with respect to at least one frequency, the processing circuitry 150 judges that the magnetic resonance imaging cannot be executed (error judgement). When the resistance values are lower than the reference values in the entire range of the plural frequencies, the processing circuitry 150 judges that the magnetic resonance imaging can be executed.

When it was judged that the magnetic resonance imaging cannot be executed, the processing circuitry 150 outputs information relating to the error judgement to the output circuitry 125 as a judgement result. In addition, in order to disable the use of the magnetic resonance imaging apparatus 100, the control function 153 in the processing circuitry 150 executes an interlock to the magnetic resonance imaging apparatus 100.

In the meantime, the processing circuitry 150 may read out from the storage circuitry 123 a reference curve which indicates the plural reference values corresponding to the plural frequencies. At this time, the processing circuitry 150 compares the reference curve and the resistance-frequency curve. When the resistance-frequency curve exceeds the reference curve with respect to at least one of the plural frequencies, the processing circuitry 150 judges that the magnetic resonance imaging cannot be executed. When the resistance-frequency curve is lower than the reference curve in the entire range of the plural frequencies, the processing circuitry 150 judges that the magnetic resonance imaging can be executed.

In addition, the processing circuitry 150 may compare the calculated plural impedances and the read-out plural reference values with respect to each of the plural frequencies. At this time, the plural reference values are reference values relating to the impedance of the gradient coil 102. Besides, the processing circuitry 150 may read out from the storage circuitry 123 the reference curve which indicates the plural reference values corresponding to the plural frequencies. At this time, the processing circuitry 150 compares the reference curve and the impedance-frequency curve. Since the process after the comparison is substantially the same as described above, a description is omitted.

FIG. 9 is a view illustrating an example of a graph relating to possibility/impossibility of execution of magnetic resonance imaging in the judgement function 155. A solid line in FIG. 9 shows a resistance-frequency curve $R(\omega)$ indicating a plurality of resistance values, which were calculated by the calculation function 154 in accordance with the frequency of the output current. A dotted line in FIG. 9 shows a reference curve which was read out from the storage circuitry 123. A dashed line in FIG. 9 shows an inductance-frequency curve $L(\omega)$ which was read out from the storage circuitry 123. As illustrated in FIG. 9, when the resistance-frequency curve $R(\omega)$ intersects with the reference curve, the processing circuitry 150 judges that the magnetic resonance imaging cannot be executed.

(Adjusting Function)

Hereinafter, the adjusting function 156, which is executed by the processing circuitry 150, is described.

When it was judged by the judgement function 155 that the magnetic resonance imaging can be executed, the processing circuitry 150 reads out from the storage circuitry 123 the program relating to the adjusting function 156 (hereinafter referred to as "adjustment program"). The processing circuitry 150 develops the adjustment program on its own memory, and executes the developed adjustment program. At this time, the processing circuitry 150 functions as an adjusting unit.

FIG. 10 is a view illustrating an example of a circuitry model (equivalent circuitry) relating to each of the X-axis gradient coil 102x, Y-axis gradient coil 102y and Z-axis gradient coil 102z in the gradient coil 102. Here, the circuitry model includes, for example, first circuitry 30, and second circuitry which is composed of closed circuitry 31 and closed circuitry 32. Incidentally, the configuration of the circuitry model illustrated in FIG. 10 is merely an example, and the restriction to the circuitry configuration of FIG. 10 is unnecessary. For example, the number of closed circuitry components is not limited to two, and may be, for example, one, or three or more.

The first circuitry 30 is connected to the gradient magnetic field power supply 103, and is composed of a resistor 38 having a resistance value $R_1$, and a coil 33 having a self-inductance $L_1$. The closed circuitry 31 in the second circuitry is composed of a resistor 36 having a resistance value $R_2$, and a coil 34 having a self-inductance $L_2$. The closed circuitry 32 in the second circuitry is composed of a resistor 37 having a resistance value $R_3$, and a coil 35 having a self-inductance $L_3$.

In addition, a mutual inductance $M_{12}$ exists between the coil 33 and coil 34, and a mutual inductance $M_{13}$ exists between the coil 33 and coil 35. Hereinafter, for the purpose of simple description, it is assumed that the closed circuitry 31 is circuitry (hereinafter referred to as "low-frequency circuitry") which contributes to generation of a low-frequency gradient magnetic field, and the closed circuitry 32 is circuitry (hereinafter referred to as "high-frequency circuitry") which contributes to generation of a high-frequency gradient magnetic field.

In the circuitry model illustrated in FIG. 10, a plurality of circuitry elements are, for example, the resistor 38 and coil 33 in the first circuitry 30, the resistor 36 and coil 34 in the closed circuitry 31, and the resistor 37 and coil 35 in the closed circuitry 32. In addition, a plurality of parameters, which can be adjusted by the adjusting function 156, are the resistance value $R_1$ of the resistor 38, the resistance value $R_2$ of the resistor 36, the resistance value $R_3$ of the resistor 37, the mutual inductance (magnetic coupling constant) $M_{12}$ between the coils 33 and coil 34, and the mutual inductance $M_{13}$ between the coils 33 and coil 35.

In the meantime, based on the circuitry model of the gradient coil 102, for example, based on the circuitry model illustrated in FIG. 10, an equation (hereinafter referred to as "model equation") indicating the consumption energy of the gradient coil 102 may be used in the calculation function 154. At this time, the model equation is used instead of the equation (6). The equation (5) is a general equation including the model equation and equation (6).

The processing circuitry 150 reads out the parameter-resistance curve from the storage circuitry 123. The processing circuitry 150 adjusts, for example, the above-described five parameters, in order to match the parameter-resistance curve with the resistance-frequency curve $R(\omega)$ calculated by the calculation function 154. The processing circuitry 150 updates the adjusted plural parameters and the parameter-resistance curve based on the adjusted parameters, and causes the storage circuitry 123 to store the updated result.

FIG. 11 is a view illustrating the resistance-frequency curve $R(\omega)$ calculated by the calculation function 154 and the parameter-resistance curve $R_0(\omega)$ stored in the storage circuitry 123, together with three resistances (offset resistance $R_{offset}$, low-frequency resistance $R_L(\omega)$ and high-frequency resistance $R_H(\omega)$) which contribute to the parameter-resistance curve $R_0(\omega)$. The offset resistance $R_{offset}$ shown in FIG. 11 corresponds to an offset component from zero resistance, and corresponds to a resistance value $R_1$. The low-frequency resistance $R_L(\omega)$ mainly contributes, as a resistance in a low-frequency band, to the parameter-resistance curve $R_0(\omega)$. The high-frequency resistance $R_H(\omega)$ mainly contributes, as a resistance in a high-frequency band, to the parameter-resistance curve $R_0(\omega)$.

The processing circuitry 150 adjusts the magnitude of the resistance value $R_1$. The adjustment of the magnitude of the resistance value $R_1$ corresponds to parallel-shifting (translating) the parameter-resistance curve $R_0(\omega)$ in the up-and-down direction. The processing circuitry 150 adjusts the mutual inductance $M_{12}$ and the resistance value $R_2$ of the resistor 36. The adjustment of the mutual inductance $M_{12}$ and the resistance value $R_2$ of the resistor 36 contributes to the shape of the function indicating the frequency dependency of the low-frequency resistance $R_L(\omega)$, and corresponds to adjusting the inclination of the parameter-resistance curve $R_0(\omega)$.

The processing circuitry 150 adjusts the mutual inductance $M_{13}$ and the resistance value $R_3$ of the resistor 37. The adjustment of the mutual inductance $M_{13}$ and the resistance value $R_3$ of the resistor 37 contributes to the shape of the function indicating the frequency dependency of the high-frequency resistance $R_H(\omega)$, and corresponds to adjusting the inclination of the parameter-resistance curve $R_0(\omega)$. By adjusting the above-described five parameters, the processing circuitry 150 matches the parameter-resistance curve with the resistance-frequency curve RM. Incidentally, the number of parameters to be adjusted is not limited the above five.

In the meantime, the processing circuitry 150 may adjust the above five parameters in order to match the parameter-resistance curve, which was read out of the storage circuitry 123, with the impedance-frequency curve calculated by the calculation function 154. At this time, the processing circuitry 150 updates the adjusted plural parameters and the impedance-frequency curve based on the adjusted parameters, and causes the storage circuitry 123 to store the updated result.

(Condition-Changing Function)

Hereinafter, the condition-changing function 157, which is executed by the processing circuitry 150, is described.

After it was judged by the judgement function 155 that the magnetic resonance imaging can be executed, and the parameters were adjusted by the adjusting function 156, the processing circuitry 150 reads out the program relating to the condition-changing function 157 (hereinafter referred to as "condition-changing program") from the storage circuitry 123. The processing circuitry 150 develops the condition-changing program on its own memory, and executes the developed condition-changing program. At this time, the processing circuitry 150 functions as a condition-changing unit. When it was judged by the judgement unit that the magnetic resonance imaging can be executed, the condition-changing unit changes the imaging condition for magnetic resonance imaging to an imaging condition corresponding to frequency characteristics.

The processing circuitry 150 changes the imaging condition, which was preset in the magnetic resonance imaging, to an imaging condition corresponding to the resistance of the gradient coil 102, which was calculated after the adjustment of the parameters. In the meantime, the processing circuitry 150 may change the preset imaging condition to an imaging condition corresponding to the calculated impedance of the gradient coil 102. The processing circuitry 150 updates the imaging condition as changed, and causes the storage circuitry 123 to store the updated imaging condition. Thereby, the imaging condition is optimized in accordance with the change of the frequency dependency of the resistance in the gradient coil 102.

Specifically, the processing circuitry 150 changes the restrictions of the imaging condition, in accordance with the values of the respective adjusted parameters. In the meantime, the processing circuitry 150 may change the restrictions of the imaging condition, in accordance with the difference between the reference curve and the resistance-frequency curve (or the impedance-frequency curve). The restrictions of the imaging condition are, for instance, the upper limit of the number of images captured per unit time, the upper limit of resolution, and the size of the effective field of view.

For example, the processing circuitry 150 lowers the upper limit of resolution in the imaging. To lower the upper limit of resolution in the slice direction corresponds to, for example, the lowering of the upper limit of thinness of the slice thickness, and corresponds to the prohibition of magnetic resonance imaging with a slice thickness which is less than a predetermined slice thickness. To lower the resolution in the read-out direction and the resolution in the phase encode direction corresponds to, for example, the lowering of the upper limit of the matrix number of an image, and corresponds to the prohibition of magnetic resonance imaging relating to an image with a matrix number which is a predetermined matrix number or more.

In the meantime, to lower the resolution in the read-out direction and the resolution in the phase encode direction corresponds to an increase of the lower limit of the size of the effective field of view (FOV: Field of View) in the imaging, and corresponds to the prohibition of magnetic resonance imaging by the FOV that is smaller than a predetermined FOV. The size in the effective field of view in the imaging relates to the magnitude of the gradient of the gradient magnetic field. Specifically, as the size of the effective field of view in the imaging becomes larger, the gradient of the gradient magnetic field becomes gentler. Thereby, it becomes possible to prevent a decrease in voltage value of the capacitor bank 21.

In addition, the processing circuitry 150 may set imaging by a specific imaging sequence to be unexecutable, as a change of the imaging condition. The specific imaging sequence is an imaging sequence with a large number of times of change or reversal of the gradient magnetic field per unit time. For example, the specific imaging sequence is echo planar imaging.

(Change-with-Time Estimation Function)

Figure 12:
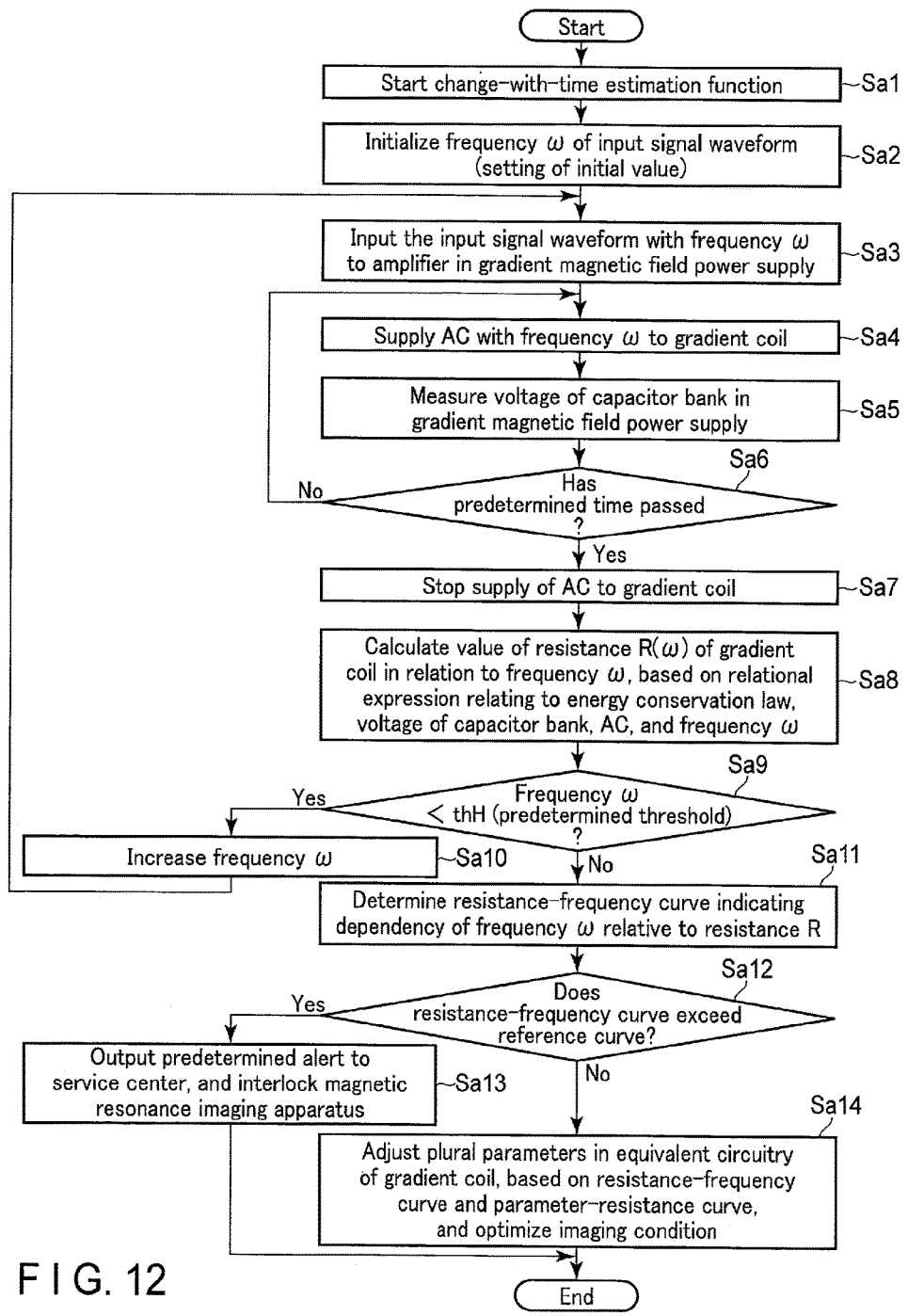
FIG. 12 is a flowchart relating to the embodiment, illustrating an example of the flow of a change-with-time estimation process.

Hereinafter, a process (hereinafter referred to as "change-with-time estimation process") relating to a change-with-time estimation function will be described. FIG. 12 is a flowchart illustrating an example of the flow of the change-with-time estimation process.

The change-with-time estimation function relating to the resistance of the gradient coil 102 is started by the operator's instruction through the input device 124, or at a predetermined time instant (step Sa1). In accordance with the start of the change-with-time estimation function, the processing circuitry 150 reads out the calculation program from the storage circuitry 123, and executes the read-out calculation program. For example, the calculation program is executed before the magnetic resonance imaging for image generation relating to the subject P.

Next, the processing circuitry 150 initializes the frequency ω of the input signal waveform which is input to the gradient magnetic field power supply 103 (step Sa2). The initialization of the frequency ω corresponds to, for example, the setting of the frequency ω to the initial value. The initial value of the frequency ω in the change-with-time estimation function is prestored in the storage circuitry 123. Hereinafter, for the purpose of simple description, it is assumed that the initial value is, for example, a minimum natural number (hereinafter referred to as "minimum value") in a plurality of preset frequencies (hereinafter "frequency range"). The frequency range is prestored in the storage circuitry 123. The frequency range corresponds to, for example, the range of frequencies on the abscissa in FIG. 6 to FIG. 9. For example, the initial value of the frequency ω is two or three frequencies included in the frequency range.

The input signal waveform having the frequency ω is input to the amplifier 22 in the gradient magnetic field power supply 103 (step Sa3). The amplifier 22 generates an AC current (output current I(t)) having the frequency ω, based on the voltages applied from the AC/DC converter 20 and capacitor bank 21, and the input signal waveform. The gradient magnetic field power supply 103 supplies the output current I(t) to the gradient coil 102 (step Sa4).

Upon being triggered by the supply of the output current I(t) to the gradient coil 102, the processing circuitry 150 starts measuring time. Specifically, the processing circuitry 150 measures a time during which the output current I(t) of the frequency ω is being supplied to the gradient coil 102. Upon being triggered by the supply of the output current I(t) to the gradient coil 102, the measuring device 127 starts measuring the voltage of the capacitor bank 21 (step Sa5).

The process of step Sa4 and step Sa5 is repeated until the measured time reaches a current supply time, that is, until a predetermined time has passed (No in step Sa6). In the meantime, the measuring device 127 may execute the measurement of the voltage of the capacitor bank 21, at a time point when the current supply time has passed since the start time of the supply of the output current I(t) to the gradient coil 102.

If the time measured by the processing circuitry 150 reaches the current supply time (Yes in step Sa6), the supply of the output current to the gradient coil 102 is stopped (step Sa7). The processing circuitry 150 calculates the value of the resistance R(ω) of the gradient coil in relation to the frequency ω, based on the relational expression relating to the energy conservation law with respect to the gradient magnetic field power supply 103 and gradient coil 102, the voltage of the capacitor bank 21, and the output current I(t) (step Sa8). Specifically, in the process of step Sa8, the resistance value R(ω) relative to the frequency ω of the output current I(t) is calculated.

If the frequency 6) of the output current I(t) is lower than a predetermined threshold thH (hereinafter referred to as "maximum threshold") (Yes in step Sa9), the frequency ω is increased by the processing circuitry 150 (step Sa10). The increase of the frequency ω may be, for example, an increment to the frequency ω, an addition of a predetermined number to the frequency ω, or a multiplication of the frequency ω by a predetermined natural number. The maximum threshold thH is prestored in the storage circuitry 123. The maximum threshold thH corresponds to, for example, a maximum value of the frequency range. At this time, the process of step Sa3 to step Sa9 is repeated.

In the meantime, the initial value is not limited to the minimum value, and may be a frequency of an arbitrary value in the frequency range. At this time, in the process of step Sa9, it is judged whether a plurality of output currents corresponding to a plurality of preset frequencies have been supplied to the gradient coil 102. In addition, in the process of step Sa10, if it is judged that the output currents having the frequencies over the entire frequency range have not been supplied to the gradient coil 102 (corresponding to Yes in step Sa9), a frequency different from the frequency ω used in step Sa8 is set as a new frequency (corresponding to step Sa10). If it is judged that the plural output currents corresponding to the plural frequencies over the entire frequency range have been supplied to the gradient coil 102 (corresponding to No in step Sa9), the process of step Sa11 (to be described later) is executed.

In the meantime, the initial value may be a maximum natural number (hereinafter referred to as "maximum value") in the frequency range. At this time, in the process of step Sa9, it is judged whether the frequency ω of the output current is greater than a threshold thL (hereinafter referred to as "minimum threshold") which is a minimum natural number in the frequency range. The minimum threshold thL is stored in the storage circuitry 123. The minimum threshold thL corresponds to, for example, a minimum value in the frequency range. In addition, if it is judged that the frequency ω of the output current is greater than the minimum threshold thL (corresponding to Yes in step Sa9), the frequency ω is decreased (corresponding to step Sa10). The decrease of the frequency ω may be, for example, a decrement to the frequency ω, or a subtraction of a predetermined number from the frequency ω. If it is judged that the frequency ω of the output current is less than the minimum threshold thL (corresponding to Nos in step Sa9), the process of step Sa11 (to be described later) is executed.

If it is judged that the frequency ω of the output current I(t) is not lower than the predetermined threshold thH (No in step Sa9), the resistance-frequency curve indicating the dependency of the frequency ω relative to the resistance R(ω) of the gradient coil 102 is determined by the calculation function 154 of the processing circuitry 150 (step Sa11). Incidentally, the process of step Sa8 may be executed immediately before the process of step S11. The processing circuitry 150 reads out the reference curve from the storage circuitry 123. By the judgement function 155 of the processing circuitry 150, the resistance-frequency curve and the reference curve are compared (step Sa12).

If the resistance-frequency curve exceeds the reference curve with respect to at least one of the plural frequencies, the judgement function 155 in the processing circuitry 150 judges that the magnetic resonance imaging is cannot be executed (Yes in step Sa12). If the resistance-frequency curve is lower than the reference curve over the entire range of the plural frequencies, the judgement function 155 in the processing circuitry 150 judges that the magnetic resonance imaging can be executed (No in step Sa12).

If it is judged that the magnetic resonance imaging cannot be executed, the control function 153 in the processing circuitry 150 executes an interlock to the magnetic resonance imaging apparatus 100. For example, the control function 153 stops the operation relating to the magnetic resonance imaging. At this time, the output circuitry 125 outputs the predetermined alert and judgement result to the external service center, etc. via the in-hospital network and predetermined gateway (step Sa13). Incidentally, the output circuitry 125 may cause the display 126 to display the predetermined alert.

If it is judged that the magnetic resonance imaging can be executed, the adjusting function 156 in the processing circuitry 150 reads out the parameter-resistance curve from the storage circuitry 123. The processing circuitry 150 adjusts the values of the parameters of the plural circuitry elements in the circuitry model relating to the gradient coil 102, in order to match the parameter-resistance curve with the resistance-frequency curve R(ω). Then, by the condition-changing function 157 of the processing circuitry 150, the upper limit of the preset imaging condition is changed in accordance with the adjusted value of each of the parameters.

Specifically, the condition-changing function 157 in the processing circuitry 150 optimizes the imaging condition in accordance with the adjusted value of each of the parameters (step Sa14). At this time, the adjusted values of the parameters and the optimized imaging condition are updated and stored in the storage circuitry 123.

According to the above-described configuration, the following advantageous effects can be obtained.

According to the magnetic resonance imaging apparatus 100 of the present embodiment, a plurality of AC currents each having a plurality of frequencies are supplied to the gradient coil 102, and the voltage of the capacitor bank 21 is measured. Thereby, the change with time, that is, the secular change, of the resistance in the gradient coil 102 and the impedance including the resistance can be estimated. Thus, according to the present magnetic resonance imaging apparatus 100, it can be judged whether the magnetic resonance imaging can be executed.

In addition, according to the present magnetic resonance imaging apparatus 100, when it was judged that the magnetic resonance imaging can be executed, the values of the plural parameters corresponding to the plural circuitry elements in the circuitry model corresponding to the gradient coil 102 are adjusted. Thereby, the imaging condition can be flexibly optimized. Furthermore, when it was judged that the magnetic resonance imaging cannot be executed, the magnetic resonance imaging apparatus 100 can be interlocked, and the predetermined alert and judgement result can be output to the external service center, display 126, etc.

From the above, according to the magnetic resonance imaging apparatus 100, the variation of the impedance including the resistance in the gradient coil 102 can be detected early. Therefore, the load characteristics of the gradient coil 102 due to the aged deterioration of the gradient coil 102 can be reflected, as needed, on the parameters in the circuitry model corresponding to the gradient coil 102, and on the imaging condition.

Thereby, according to the magnetic resonance imaging apparatus 100, the load on the gradient magnetic field power supply 103 can be reduced, and the optimal magnetic resonance imaging can be provided. Moreover, since the power margin in the gradient magnetic field power supply 103 can be reduced, the power design with excessively high specifications can be improved to the power design with proper specifications, and therefore the manufacturing cost can be reduced.

From the above, according to the magnetic resonance imaging apparatus 100, the degradation of the gradient coil 102 can be estimated before detecting performance degradation of the gradient coil, based on degradation in image quality or an output error of the gradient magnetic field power supply. Specifically, according to the present embodiment, there can be provided the magnetic resonance imaging apparatus 100 which enables early ascertainment of performance degradation of the gradient coil 102.

The instructions, which are shown in the process procedures illustrated in the above-described embodiment, can be executed based on a program that is software. A general-purpose computer system may prestore this program, and may read in this program. Thereby, the same advantageous effects as those by the magnetic resonance imaging apparatus 100 of the above-described embodiment can be obtained. The instructions described in the above embodiment is stored as a computer-executable program in a storage medium such as a magnetic disk (e.g. a flexible disk, a hard disk), an optical disk (e.g. a CD-ROM, a CD-R, a CD-RW, a DVD-ROM, a DVD±R, a DVD±RW), a semiconductor memory, or the like. The storage form of this storage medium may be any form as long as the storage medium is readable by a computer or an embedded system.

At this time, if the computer reads in the program from this storage medium and executes, based on this program, the instructions described in the program by the CPU, the same operation as that of the magnetic resonance imaging apparatus 100 of the above embodiment can be realized.

Needless to say, when the computer acquires or reads in the program, the computer may acquire or read in the program via a network.

Additionally, an OS (operating system) running on the computer based on the instructions of the program installed from the storage medium into the computer or embedded system, or MW (middleware), such as database management software or network software, may execute a part of each of processes for realizing the above embodiment.

Additionally, the storage medium is not limited to a medium which is independent from the computer or embedded system, and includes a storage medium which stores or temporarily stores, by download, a program which is transmitted over a LAN (Local Area Network) or the Internet.

Additionally, the number of storage media is not limited to one. The configuration of the storage media in the embodiment includes such a case that the process in the above-described embodiment is executed from a plurality of media, and the configuration of the media may be any configuration.

Incidentally, the computer or embedded system in the embodiment is a computer or embedded system for executing each process in the embodiment, based on the program stored in the storage medium. The computer may have any configuration, for example, a configuration as a single apparatus such as a personal computer or a microcomputer, or a configuration as a system in which a plurality of apparatuses are connected over a network.

Additionally, the computer in each embodiment is not limited to a personal computer, and is a general concept of equipment and apparatuses including an arithmetic processing apparatus included in information processing equipment, a microcomputer, etc., which can realize the functions in the embodiment by programs.

According to the magnetic resonance imaging apparatus of the above-described embodiment, etc., the performance degradation of the gradient coil can be ascertained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising:
   a gradient magnetic field power supply including an amplifier configured to amplify an input signal based on information of a gradient magnetic field waveform and output the amplified input signal to a gradient coil, a power supply device configured to supply power to the amplifier, and a capacitor bank configured to supply power, together with the power supply device, to the amplifier;
   a voltmeter configured to measure a voltage of the capacitor bank;
   storage circuitry to store a plurality of parameters of a circuitry model that is equivalent to the gradient coil, the parameters including a resistance value corresponding to a resistance element in the circuitry model, a mutual inductance corresponding to two coils that interact magnetically in the circuitry model, and a self-inductance in the coil itself in the circuitry model; and
   processing circuitry configured to calculate frequency characteristics of an impedance of the gradient coil, based on a voltage variation of the capacitor bank measured by the voltmeter, adjust the parameters in the circuitry model, based on the calculated frequency characteristics of the impedance, and control imaging in accordance with the calculated frequency characteristics.

2. The magnetic resonance imaging apparatus according to claim 1, wherein the processing circuitry is further configured to judge whether the imaging can be executed, by comparing the calculated frequency characteristics with a reference value.

3. The magnetic resonance imaging apparatus according to claim 2, wherein the processing circuitry is further configured to judge that the imaging can be executed when the imaging is executable by changing an imaging condition.

4. The magnetic resonance imaging apparatus according to claim 1, wherein the processing circuitry is further configured to calculate the frequency characteristics of the impedance, based on a voltage value of the capacitor bank.

5. The magnetic resonance imaging apparatus according to claim 2, wherein the processing circuitry is further configured to change an imaging condition of the imaging to an imaging condition corresponding to the calculated frequency characteristics, when it is judged that the imaging can be executed.

6. The magnetic resonance imaging apparatus according to claim 2, further comprising output circuitry configured to output an alert when it is judged by the processing circuitry that the imaging cannot be executed.

7. The magnetic resonance imaging apparatus according to claim 6, wherein the output circuitry is further configured to display the alert on a display.

8. The magnetic resonance imaging apparatus according to claim 6, wherein the output circuitry is further configured to output the alert to a service center connected via a network.

9. The magnetic resonance imaging apparatus according to claim 2, wherein the processing circuitry is further configured to stop an operation relating to the imaging, when it is judged that the imaging cannot be executed.

\* \* \* \* \*